US006885437B2

(12) United States Patent
Nishi et al.

(10) Patent No.: US 6,885,437 B2
(45) Date of Patent: Apr. 26, 2005

(54) MASK EXCHANGING METHOD AND EXPOSURE APPARATUS

(75) Inventors: Kenji Nishi, Yokohama (JP); Katsunobu Ogura, Sendai (JP); Hidekazu Kikuchi, Watari-gun (JP)

(73) Assignees: Nikon Corporation, Tokyo (JP); Sendai Nikon Corporation, Natori (JP)

( * ) Notice: Subject to any disclaimer, the term of this patent is extended or adjusted under 35 U.S.C. 154(b) by 0 days.

(21) Appl. No.: 10/781,661

(22) Filed: Feb. 20, 2004

(65) Prior Publication Data

US 2004/0223132 A1 Nov. 11, 2004

Related U.S. Application Data

(63) Continuation of application No. PCT/JP02/08386, filed on Aug. 20, 2002.

(30) Foreign Application Priority Data

Aug. 20, 2001 (JP) ........................................ 2001-248797

(51) Int. Cl.[7] ........................ G03B 27/62; G03B 27/32; G03B 27/42
(52) U.S. Cl. .............................. 355/75; 355/53; 355/77
(58) Field of Search ............................. 355/53, 75, 76, 355/77; 414/935

(56) References Cited

U.S. PATENT DOCUMENTS 4,924,258 A 5/1990 Tsutsui
5,442,163 A * 8/1995 Nakahara et al. ........... 235/381
6,414,744 B1 * 7/2002 Kuiper et al. ................. 355/75
2002/0024647 A1 * 2/2002 Nakahara et al. ............. 355/53

FOREIGN PATENT DOCUMENTS

| EP | 1052547 A2 | 11/2000 |
| JP | 2-142112 | 5/1990 |
| JP | 8-293455 | 11/1996 |
| JP | 11-145048 | 5/1999 |
| JP | 11-307425 | 11/1999 |

OTHER PUBLICATIONS

Translation of JP 08–293455 cited on PTO–1449, Hidehiko et al., Nov. 5, 1996.*
Translation of JP 11–145048 cited on PTO–1449, Kanefumi., May 28, 1999.*
Translation of JP 11–307425 cited on PTO–1449, Takechika, Nov. 5, 1999.*

* cited by examiner

Primary Examiner—Alan Mathews
(74) Attorney, Agent, or Firm—Oblon, Spivak, McClelland, Maier & Neustadt, P.C.

(57) ABSTRACT

When a reticle stage capable of moving while holding a reticle is at a predetermined unloading position, an unloading arm performs unloading of a reticle. Also, the instant or immediately after the reticle is separated from the reticle stage by the unloading arm, the reticle stage is moved to a predetermined loading position where a reticle is loaded onto the reticle stage by a loading arm. This allows the reticle to be loaded onto the reticle stage before the unloading arm completely withdraws from the unloading position, which reduces the downtime between the retile unloading and the reticle loading. Accordingly, the throughput of the exposure apparatus can be improved, since the time required for reticle exchange is reduced.

22 Claims, 9 Drawing Sheets

MASK EXCHANGING METHOD AND EXPOSURE APPARATUS

CROSS-REFERENCE TO RELATED APPLICATIONS

This is a continuation of International Application PCT/JP02/08386, with an international filing date of Aug. 20, 2002, the entire content of which being hereby incorporated herein by reference, which was not published in English.

BACKGROUND OF THE INVENTION

1. Field of the Invention

The present invention relates to mask exchanging methods and exposure apparatus, and more particularly to a mask exchanging method in which a mask is loaded on a mask stage while a used mask is unloaded from the mask stage, and an exposure apparatus to which the mask exchanging method is suitably applied.

2. Description of the Related Art

Conventionally, in a lithographic process to produce liquid crystal display devices or the like, from the viewpoint of emphasizing the importance of throughput due to recent higher integration of semiconductor devices or the like and the increasing size of a substrate such as a wafer, a mask or a reticle (hereinafter generally referred to as a 'reticle'), projection exposure apparatus of a sequentially moving type, such as a reduction projection exposure apparatus based on a step-and-repeat method and an improvement of such a stepper like a scanning exposure apparatus based on a step-and-scan method (the so-called scanning stepper) are mainly used.

For example, in a conventional scanning stepper, as a reticle carriage mechanism for loading and unloading a reticle on a reticle stage where the reticle is to be held, a mechanism such as the one shown in FIG. 9 in a planar view has been used. FIG. 9 shows a reticle carriage mechanism 120, which comprises a drive shaft 104 driven by a vertical/rotational mechanism (not shown), an arm drive section 102 fixed to the lower end portion of drive shaft 104 (the end in depth of the page surface of FIG. 9), a pair of arms 106A and 106B provided on one side of arm drive section 102, and a pair of arms 108A and 108B provided on the other side of arm drive section 102. In reticle carriage mechanism 120, the entire structure including arm drive section 102 and the two pair of arms 106A and 106B, and 108A and 108B, is drivable by the vertical/rotational mechanism via drive shaft 104, in a vertical direction (the perpendicular direction to the page surface in FIG. 9) and in a rotational direction. In addition, arms 106A and 106B, and 108A and 108B operate (open/close) under the control of arm drive section 102.

Reticle exchange by reticle carriage mechanism 120 is basically performed in the following manner.

First of all, as is shown in FIG. 9, on a waiting table 110, a reticle outline alignment mechanism consisting of positioning pins 112A to 112E that can be simultaneously opened/closed holds a reticle R1 whose position is mechanically set in advance by suction, with arms 108A and 108B. And, in parallel with this operation, on a reticle stage RST, a reticle R2 is held by suction by arms 106A and 106B. Then, the vertical/rotational mechanism drives arm drive section 102 integrally with drive shaft 104 upward a predetermined amount. With this operation, arms 108A and 108B, and arms 106A and 106B that are holding reticles R1 and R2 unload them from waiting table 110 and reticle stage RST, respectively Then, immediately after the unloading, positioning pins 112A to 112E move outward from their positions shown in FIG. 9 (move in an open direction).

Next, the vertical/rotational mechanism rotates arm drive section 102 integrally with drive shaft 104 at an angle of 180 degrees, so that reticle R1 is located above reticle stage RST and reticle R2 is located above waiting table 110. Then, the vertical/rotational mechanism drives arm drive section 102 integrally with drive shaft 104 downward, and loads reticle R1 and reticle R2 on reticle stage RST and waiting table 110, respectively.

Then, arms 108A and 108B, and arms 106A and 106B release the suction of the reticles and perform an opening operation. Then, arm drive section 102 integrally withdraws upward with drive shaft 104 via the vertical/rotational mechanism, which completes the reticle exchange.

However, in the above conventional reticle carriage mechanism 120, the unloading of the reticles from waiting table 110 and reticle stage RST is performed at the same time, likewise the loading of the reticles onto waiting table 110 and reticle stage RST. Therefore, preparatory operations for reticle exchange is hardly possible while reticle stage RST is at the exposure position, and furthermore because the reticle is carried from waiting table 110 to reticle stage RST (and from reticle stage RST to the waiting table) by the rotational operation of the drive shaft by 180 degrees, the rotating period becomes a full waiting time from the viewpoint of the reticle stage RST side. Such a waiting time of the reticle stage occurring was one of the reasons for the throughput being reduced in the entire exposure process.

In addition, in reticle carriage mechanism 120, as is previously described, after reticle alignment processing (mechanical positioning by the reticle outline alignment mechanism) has been performed, a total of two reticle delivery operations were performed; unloading the reticle from waiting table 110, and loading the reticle on reticle stage RST. This consequently reduced the carriage accuracy, because in such a case, the reticle was loaded onto the reticle stage with the displacement occurring due to delivery. In addition, in such a case, when the displacement is large, cases may occur when rough alignment (pre-alignment) is necessary prior to a fine alignment operation when performing reticle alignment before exposure, or depending on the movable range of the reticle stage (especially in the non-scanning direction and the rotational direction) that has been set, correction may be difficult. In the latter case, the reticle loading will have to be performed again.

In addition, recently, from the viewpoint of improving throughput, exposure apparatus are being developed that are based on a double wafer stage method where two wafer stages are used and while exposure operation is being performed on one wafer stage, wafer exchange and wafer alignment are being performed on the other wafer stage. With this kind of exposure apparatus, exposure operation has to be continuously performed, only to be suspended when reticle exchange is performed on the reticle stage side; therefore, prearrangements for exchanging the reticle are preferably made while exposure operation is being performed from the viewpoint of improving the throughput. However, as is previously described, in the conventional reticle carriage mechanism 120, preparatory operations for reticle exchange can hardly be performed while reticle stage RST is at the exposure position, and furthermore, as it is obvious from FIG. 9, because reticle stage RST and reticle carriage mechanism are both arranged on the same body, the exposure accuracy could be degraded due to vibration that is likely to occur in the preparatory operations for reticle exchange. Accordingly, the conventional reticle carrier system may possibly be an obstacle when achieving high throughput, which is supposed to be the biggest advantage that the exposure apparatus based on the double wafer stage method originally has.

SUMMARY OF THE INVENTION

The present invention was made under such circumstances, and has as its first object to provide a mask exchanging method in which the time required for exchanging the mask can be reduced.

In addition, the second object of the present invention is to provide an exposure apparatus that can especially improve throughput.

According to a first aspect of the present invention, there is provided a mask exchanging method in which mask exchange is performed on a mask stage movable in a predetermined direction, the method comprising: an unloading process in which an unloading arm unloads a mask from the mask stage when the mask stage holding the mask is at a predetermined unloading position; a loading process in which a loading arm drivable independently from the unloading arm loads a mask on the mask stage when the mask stage holds the mask at a predetermined loading position different from the unloading position; and a moving process in which the mask stage is moved from the unloading position to the loading position in between the unloading process and the loading process.

According to this method, when the mask stage holding a mask is at the predetermined unloading position, the mask is unloaded from the mask stage by the unloading arm, and before the unloading sequence is completed, that is, at some point after the mask has been separated form the mask stage by the unloading arm, the mask stage is moved from the unloading position to the predetermined loading position where a mask is loaded onto the mask stage by the loading arm. Accordingly, by the mask stage moving to the loading position the instant or immediately after the mask is separated from the mask stage by the unloading arm, a mask can be loaded onto the mask stage prior to the complete withdrawal of the unloading arm from the unloading position. Such an arrangement allows the downtime (corresponds to the conventional waiting time previously described) that occurs in between the unloading of the mask from the mask stage by the unloading arm and the loading of a mask onto the mask stage by the loading arm to be reduced, which makes it possible to reduce the time required for mask exchange.

In this case, the method can further comprise: a measuring process in which a relative position between the mask and the loading arm is measured in a noncontact manner by the time a mask is loaded onto the mask stage; and an adjustment process in which a positional relation between the mask and the mask stage is adjusted when loading of the mask by the loading arm onto the mask stage is performed, taking into consideration results of the measuring.

According to a second aspect of the present invention, there is provided a first exposure apparatus that transfers a pattern formed on a mask onto a photosensitive object, the apparatus comprising: a mask stage that holds the mask and is movable in at least a predetermined uniaxial direction; a mask carrier system that has a loading arm that loads a mask onto the mask stage when the mask stage is at a predetermined loading position and an unloading arm that is driven independently from the loading arm and unloads a mask from the mask stage when the mask stage is at an unloading position different from the loading position; and a stage control unit that moves the mask stage from the unloading position to the loading position in between unloading operation of the mask by the unloading arm and loading operation of a mask by the loading arm.

With this apparatus, when the mask stage movable in at least a predetermined uniaxial direction holding a mask is at the predetermined unloading position, the unloading arm that structures the mask carrier system unloads the mask from the mask stage, and before the unloading sequence is completed, that is, at some point after the mask has been separated form the mask stage by the unloading arm, the stage control unit moves the mask stage from the unloading position to the predetermined loading position where a mask is loaded onto the mask stage by the loading arm that structures the mask carrier system. Accordingly, by the mask stage moving to the loading position the instant or immediately after the mask is separated from the mask stage by the unloading arm, a mask can be loaded onto the mask stage prior to the complete withdrawal of the unloading arm from the unloading position. Such an arrangement allows the downtime (corresponds to the conventional waiting time previously described) that occurs in between the unloading of the mask from the mask stage by the unloading arm and the loading of a mask onto the mask stage by the loading arm to be reduced, which makes it possible to reduce the time required for mask exchange.

In this case, the exposure apparatus can further comprise an object stage that holds the photosensitive object, and in the case when the mask stage and the object stage are synchronously driven when pattern transfer is performed, the unloading position and the loading position can be set apart in the uniaxial direction in which the mask stage moves on the pattern transfer.

With the first exposure apparatus in the present invention, the apparatus can further comprise: a noncontact position measuring unit that measures a relative position between the mask and the loading arm in a noncontact manner by the time a mask is loaded onto the mask stage; and a control unit that adjusts a positional relation between the mask and the mask stage when loading of the mask by the loading arm onto the mask stage is performed, taking into consideration results of the measuring by the noncontact position measuring unit.

With the first exposure apparatus in the present invention, loading of a mask onto the mask stage and unloading of a mask from the mask stage can be performed by combining relative movement of the loading arm and the unloading arm, respectively, and the mask stage within a predetermined plane, and relative movement of the loading arm and the unloading arm, respectively, and the mask stage in a direction perpendicular to the predetermined plane.

In this case, at least one of the loading arm and the unloading arm can be movable in both the predetermined plane and in the direction perpendicular to the predetermined plane.

With the first exposure apparatus in the present invention, a plurality of masks can be mounted on the mask stage along a collinear direction in which the loading position and the unloading position are arranged.

In this case, the apparatus can further comprise: a plurality of object stages that can move independently, each holding the photosensitive object.

With the first exposure apparatus in the present invention, the apparatus can further comprise: an unloading buffer on which a mask that has been unloaded from the mask stage is mounted.

In this case, the apparatus can further comprise: a loading buffer on which a mask to be loaded onto the mask stage is temporarily mounted.

In this case, a positioning unit that mechanically positions a mask can be provided on said loading buffer.

With the first exposure apparatus in the present invention, the apparatus can further comprise: a plurality of object stages that can move independently, each holding the photosensitive object.

According to a third aspect of the present invention, there is provided a second exposure apparatus that transfers a pattern formed on a mask onto a photosensitive object, the apparatus comprising: a mask stage that holds the mask and is movable in at least a predetermined uniaxial direction; a mask carrier system that includes a loading arm used for loading the mask onto the mask stage and an unloading arm driven independently from the loading arm for unloading the mask from the mask stage; a position measuring unit that measures a relative position between the mask and the loading arm in a noncontact manner by the time a mask is loaded onto the mask stage; and a control unit that adjusts a positional relation between the mask and the mask stage when loading of the mask by the loading arm onto the mask stage is performed, taking into consideration measurement results of the position measuring unit, and an unloading position where the unloading arm performs unloading operation of a mask and a loading position where the loading arm performs loading operation of a mask with respect to the mask stage are set at different positions, and the apparatus further comprising: a stage control unit that moves the mask stage from the unloading position to the loading position in between unloading operation of a mask from the mask stage by the unloading arm and loading operation of a mask onto the mask stage by the loading arm.

With this apparatus, the position measuring unit measures the relative position between the mask and the loading arm in a noncontact manner by the time a mask is loaded onto the mask stage, and the control unit adjusts the positional relation between the mask and the mask stage when loading of the mask by the loading arm onto the mask stage is performed, taking into consideration measurement results of the position measuring unit. That is, because the mask is loaded onto the mask stage, taking into consideration the relative positional relation between the mask and the loading arm, the mask can be loaded onto the desired position on the mask stage without any displacement. And, because the pattern formed on the mask is transferred onto the photosensitive object using the mask loaded onto the desired position on the mask stage in the manner described above, pattern transfer with high precision can be achieved.

BRIEF DESCRIPTION OF THE DRAWINGS

In the accompanying drawings.

DETAILED DESCRIPTION OF THE PREFERRED EMBODIMENTS

First Embodiment

A first embodiment of the present invention is described, referring to FIGS. 1 to 7C.

Figure 1:
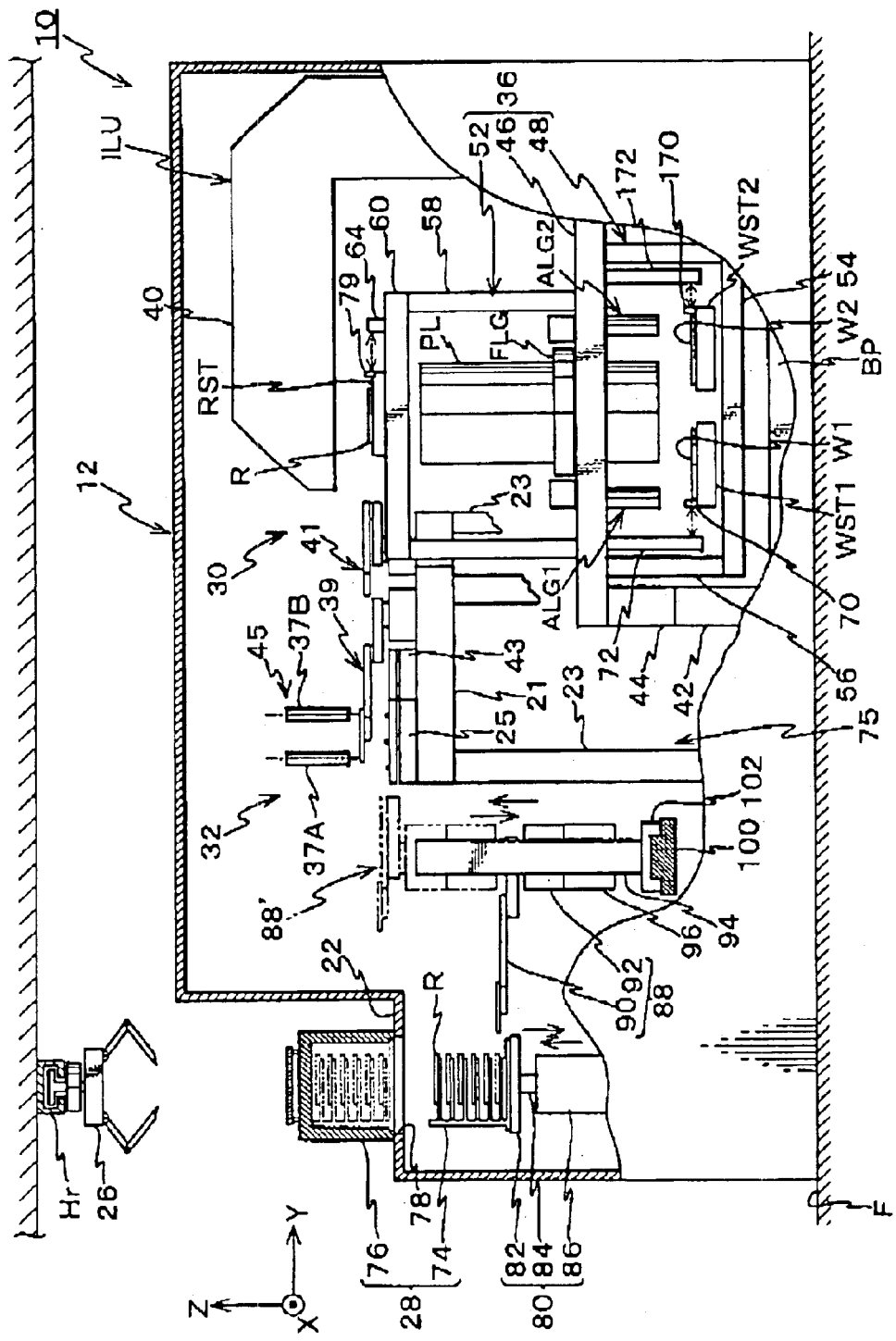
FIG. 1 is a view showing a general structure of an exposure apparatus related to a first embodiment in the present invention.

FIG. 1 shows a partially broken view of an exposure apparatus 10 related to the first embodiment. Exposure apparatus 10 is arranged in a clean room whose degree of cleanliness is around class 100 to 1000. The inner space of exposure apparatus 10 is dustproof to a high extent, and it comprises an environmental chamber 12 where temperature control is performed with high precision (hereinafter simply referred to as 'main body chamber 12'), an exposure apparatus main body 30 arranged in main body chamber 12, a reticle carrier system 32 provided in the vicinity of exposure apparatus main body 30, and the like. The chemical cleanliness degree is also maintained at a certain level within main body chamber 12.

In the −Y end of main body chamber 12 (the left hand side in FIG. 1), a low stepped section is made whose ceiling is lower when compared with other sections. At this low stepped section, a load/unload port 22 for mask containers is arranged. Via this load/unload port 22, a ceiling carrier system, which will be described later on, loads or unloads reticles serving as masks with respect to main body chamber 12 in a state where the reticles are housed in a reticle carrier 28. On the ceiling of the clean room at a position substantially above load/unload port 22, a guide rail Hr, which is a track of a ceiling carrier system 26 (hereinafter referred to as 'OHV') called OHV (Over Head Vehicle) or OHT (Over Head Transfer) that carries the reticles housed in a reticle carrier, is built (laid), extending in an X-axis direction.

As reticle carrier 28 in this case, as an example, a SMIF (Standard Mechanical Interface) pod is used, which is a bottom-open type sealed container that can house a plurality of reticles spaced apart at a predetermined interval in the vertical direction.

Exposure apparatus main body 30 comprises an illumination unit ILU that illuminates a reticle R with a pulsed ultraviolet light from a light source (not shown) provided outside main body chamber 12, a reticle stage RST serving as a mask stage that holds reticle R, a projection optical system PL that projects an illumination light (pulsed ultraviolet light) outgoing from reticle R onto wafers W1 and W2 serving as photosensitive objects, wafer stages WST1 and WST2 that hold wafers W1 and W2, respectively, and the like. And, exposure apparatus main body 30 further comprises a main body 36 or the like that holds parts such as a part of illumination unit ILU, reticle stage RST, projection optical system PL, and wafer stage WST.

As is disclosed in, for example, Japanese Patent Application Laid-open No. H01-259533 (corresponding U.S. Pat. No. 5,307,207), illumination unit ILU comprises an illumination system housing 40, and an illumination optical system arranged inside illumination system housing 40 in a predetermined positional relationship that has a variable attenuator, a beam shaping optical system, an optical integrator (such as a fly-eye lens, an internal reflection type integrator, or a diffractive optical element), a condenser optical system, a vibration mirror, an illumination system aperture stop plate, a relay lens system, a reticle blind, a main condenser lens, a mirror, a lens system, and the like. And, illumination unit ILU illuminates a predetermined illumination area (a slit shaped or a rectangular shaped area that extends linearly in the X-axis direction) on reticle R held on reticle stage RST with a uniform illuminance distribution. The rectangular slit shaped illumination light irradiated on reticle R is set so that it narrowly extends in the X-axis direction (non-scanning direction) in the center of a circular projection field of projection optical system PL in FIG. 1, and the width of the illumination light in a Y-axis direction (scanning direction) is set substantially constant.

Main body 36 comprises a plurality of support members 42 (in this case, three) provided on a base plate BP, a barrel supporting platform 46 supported substantially horizontal via vibration isolation units 44, which are fixed on the upper end of each of the support member 42, suspension columns 48 suspending from the lower surface of barrel supporting platform 46, and support columns 52 provided on barrel supporting platform 46.

Vibration isolation units 44 are structured, for example, including air mounts whose internal pressure can be adjusted and voice coil motors that are arranged in serial (or in parallel) on the upper end of each of the support members 42. Such vibration isolation units 44 insulate subtle vibration from a floor surface F, which travels to barrel supporting platform 46 via base plate BP and support members 42, at a micro-G level.

Barrel supporting platform 46 is built from a casting or the like, and in the center in a planar view (when viewed from above), a circular opening is formed where projection optical system PL is inserted from above, with its optical axis direction serving as a Z-axis direction. On the outer periphery of the barrel section of projection optical system PL, a flange FLG is provided integral with the barrel section, and projection optical system PL is attached to barrel supporting platform 46 via flange FLG.

Suspension columns 48 comprise a wafer base supporting platform 54, and a plurality of suspension members 56 (in this case, three) that support wafer base supporting platform 54 by suspension almost horizontally.

In addition, support columns 52 comprise legs 58 (for example, three legs) that are arranged on the upper surface of barrel supporting platform 46 enclosing projection optical system PL, and a reticle base supporting platform 60, which is supported in a substantially horizontal manner by these legs 58. In addition, on the upper surface of barrel supporting platform 46, a support member (not shown) is provided that supports a part of illumination unit ILU from underneath.

Reticle stage RST is arranged on reticle base supporting platform 60, which structures support columns 52. Reticle stage RST is driven by a reticle stage drive system 62 (not shown in FIG. 1, refer to FIG. 5), which includes parts such as a linear motor, and reticle stage RST is made so that it can linearly drive reticle R with large strokes in the Y-axis direction on reticle base supporting platform 60, and can also finely drive reticle R in the X-axis direction and the θz direction (the rotational direction around the Z-axis).

Figure 2:
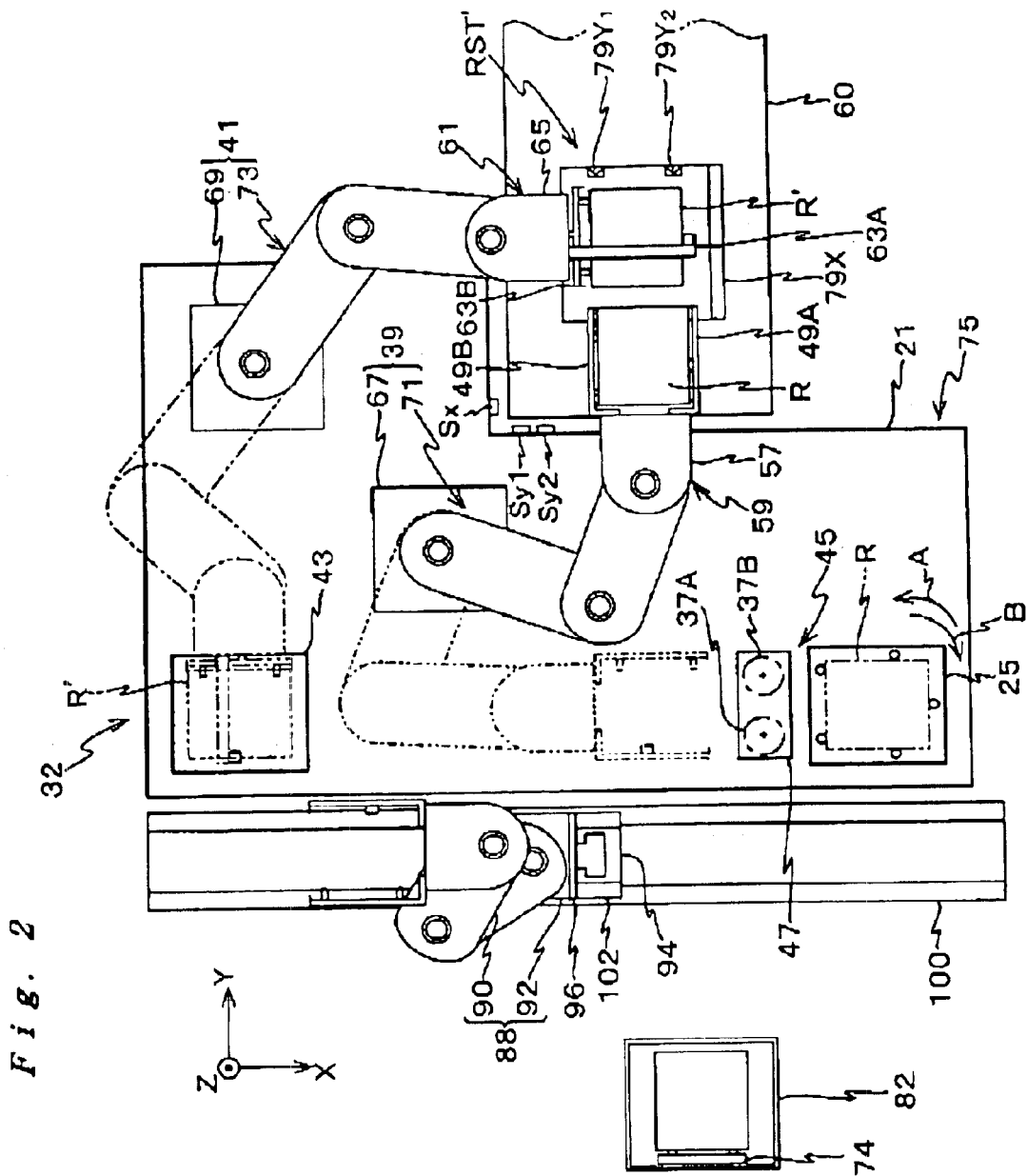
FIG. 2 is a planar view that shows a reticle carrier system and its periphery.

The position of reticle stage RST within an XY plane (including θz rotation, which is rotation around the Z-axis) is detected with a reticle laser interferometer 64 fixed on reticle base supporting platform 60 via a movable mirror 79 arranged on a part of reticle stage RST, at a resolution of 0.5 to 1 nm. In actual, as is shown in FIG. 2, Y-axis movable mirrors $79Y_1$ and $79Y_2$ consisting of a pair of corner cubic mirrors (retroreflector) are arranged on the upper surface of reticle stage RST on the +Y side end, and on the +X side end, an X-axis movable mirror 79X consisting of a planar mirror is provided extending along the Y-axis direction. In addition, corresponding to these mirrors, a pair of Y-axis laser interferometers that are used for measuring the position in the Y-axis direction and an X-axis laser interferometer that is used for measuring the position in the X-axis direction are provided, respectively, although not shown. From this description, the movable mirror and the interferometer provided are obviously in plurals, however, in FIG. 1, these are representatively shown as movable mirror 79 and reticle laser interferometer 64.

Incidentally, for example, the edge surface of reticle stage RST can be mirror polished in order to form reflection surfaces (that correspond to movable mirror 79X, and $79Y_1$ and $79Y_2$). In addition, the reticle interferometer may irradiate a laser beam onto a reflection surface provided on the lower surface of reticle stage RST and a reflection surface arranged on barrel supporting platform 46 where projection optical system PL is mounted, and the relative position of projection optical system PL in the optical axis direction (the Z-axis direction) may be detected. When the detection is performed, by detecting the relative position in the Z-axis direction at a plurality of points within the XY plane and adding the positional information of reticle stage RST in the Z-axis direction, inclination information with respect to the XY plane (that is, at least either the rotational amount around the X-axis or the rotational amount around the Y-axis) may be obtained.

Figure 5:
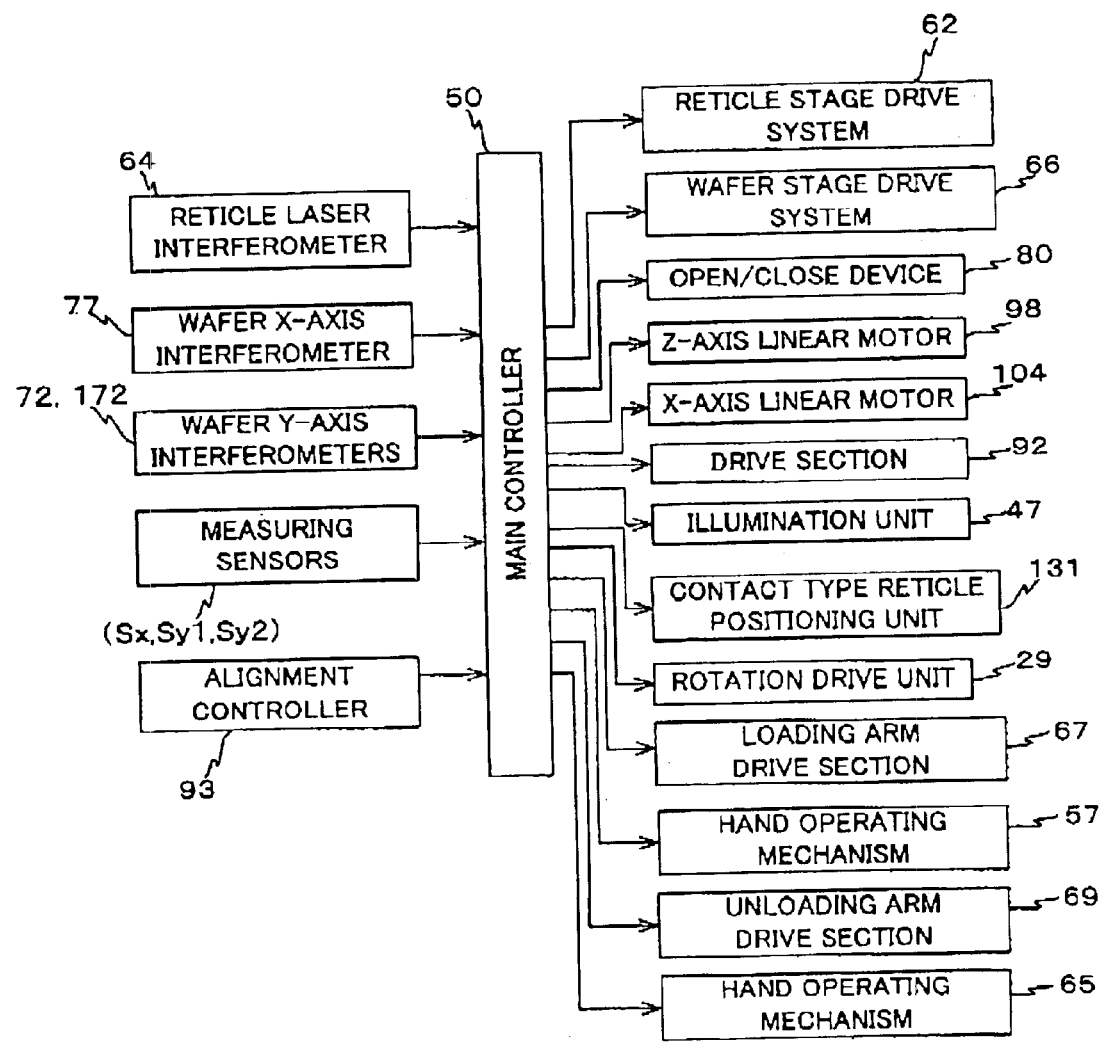
FIG. 5 is a block diagram showing a control system of the first embodiment.

The positional information (or velocity information) of reticle stage RST (or, in other words, reticle R) measured by reticle laser interferometer 64 is sent to a main controller 50 (refer to FIG. 5). Main controller 50 basically controls reticle stage drive system 62 so that the positional information (or velocity information) output from reticle laser interferometer 64 coincides with instructed values (target position and target velocity).

As projection optical system PL, in this case, a dioptric system is used whose reduction magnification is ¼, ⅕, or ⅙ consisting of only refracting optical elements (lens elements) made from glass materials such as quartz or fluorite, and the system is telecentric on both the object plane (reticle R) and the image plane (wafer W1 (or W2)) sides having a circular projection view. Therefore, when a pulsed ultraviolet light is irradiated on reticle R, the imaging beam outgoing from the part irradiated with the pulsed ultraviolet light in the circuit pattern area on reticle R enters projection optical system PL and a partially inverted image of the circuit pattern is formed limited in a slit or a rectangular (polygonal) shape in the center of the circular field on the image plane side of projection optical system PL each time the pulse irradiation of the pulsed ultraviolet light occurs. In this manner, the partially inverted image of the projected circuit pattern is reduced and transferred onto a shot area among a plurality of shot areas on wafer W1 (or W2) arranged on the image forming plane of projection optical system PL, onto its resist layer, which is the shot area surface.

On both sides in the Y-axis direction (one side and the other side) of projection optical system PL, a pair of alignment systems ALG1 and ALG2 that have the same function based on an off-axis method serving as a mark detection system are arranged, each at a position equally apart from the optical axis of projection optical system PL (substantially coinciding with the projection center of the reticle pattern image).

As alignment systems ALG1 and ALG2, in the embodiment, an alignment sensor of an FIA (Field Image Alignment) system is used that is a type of an image forming alignment sensor based on an image processing method. These alignment systems ALG1 and ALG2 are structured including parts such as a light source (for example, a halogen lamp) and an image forming optical system, an index plate on which index marks serving as a detection reference are formed, and an imaging device (CCD). In these alignment systems ALG1 and ALG2, marks subject to detection are illuminated with a broadband light from the light source, and then the CCD receives the reflection light from the vicinity of the marks via the image forming optical system and the index. In this case, the image of the marks is formed on the imaging plane of the CCD along with the index image. And, by performing a predetermined processing on the picture signals (imaging signals) from the CCD, the position of the marks are measured with reference to the center of the index mark which is the detection reference point.

It is a matter of course, that the alignment sensor used is not limited to the FIA system, and an alignment sensor that detects scattered light or diffracted light generated from an object mark when a coherent detection light is irradiated on the object mark, or an alignment sensor that performs detection by making the two diffracted beams (for example, of the same order) generated from the object mark interfere with each other can be used alone, or appropriately combined.

In the embodiment, alignment system ALG1 is used for measuring the position of alignment marks on the wafer held on wafer stage WST1, fiducial marks formed on a fiducial mark plate, or the like. In addition, alignment system ALG2 is used for measuring the position of alignment marks on the wafer held on wafer stage WST2, fiducial marks formed on a fiducial mark plate, or the like.

Wafer stages WST1 and WST2 are arranged on wafer base supporting platform 54, which structures suspension columns 48 referred to earlier, and the stages are freely driven within the XY plane by a wafer stage drive system 66 (not shown in FIG. 1, refer to FIG. 5) that includes parts such as a linear motor.

On the upper surfaces of wafer stages WST1 and WST2, wafers W1 and W2 are fixed by vacuum chucking or the like, respectively, via wafer holders (not shown). In addition, on the upper surfaces of wafer stages WST1 and WST2, X movable mirrors consisting of planar mirrors extending in the Y-axis direction are provided on one end in the X-axis direction, and Y movable mirrors consisting of planar mirrors extending in the X-axis direction are provided on one end in the Y-axis direction. In FIG. 1, however, these mirrors are representatively shown as movable mirror 70 and movable mirror 170. Incidentally, the edges of wafer stages WST1 and WST2 may be mirror polished, in order to make the reflection surfaces (corresponding to the above X movable mirrors and Y movable mirrors).

In addition, on both sides (one side and the other side) of projection optical system PL in the Y-axis direction below barrel supporting platform 46, wafer Y-axis interferometers 72 and 172 are provided for detecting the position of wafer stages WST1 and WST2 in the Y-axis direction. In addition, on the −X side of projection optical system PL below barrel supporting platform 46, a wafer X-axis interferometer 77 (not shown in FIG. 1, refer to FIG. 5) is provided for detecting the position of wafer stages WST1 and WST2 in the X-axis direction. These interferometers 72, 172, and 77 emit laser beams generated by a laser head (not shown) arranged on the upper surface of barrel supporting platform 46 toward movable mirrors 70 and 170, via a relay optical system (not shown) made up of a beam splitter, a mirror, and the like arranged within barrel supporting platform 46.

Although it is omitting in the drawings, wafer Y-axis interferometers 72 and 172 have length measuring axes that pass through the optical axis of projection optical system PL and the optical axes of alignment system ALG1 and ALG2. In addition, water X-axis interferometer 77 has a length measuring axis that is perpendicular with each length measuring axis of wafer Y-axis interferometers 72 and 172 and the optical axis of projection optical system PL, a length measuring axis that is perpendicular with the optical axis of alignment system ALG1, and a length measuring axis that is perpendicular with the optical axis of alignment system ALG2. Due to such an arrangement, the position of wafer stages WST1 and WST2 can be measured without the so-called Abbe error occurring in both cases when exposure is performed using projection optical system PL and when wafer alignment using alignment system ALG1 or ALG2 is performed.

In the embodiment, X-axis and Y-axis interferometers are multi-axis interferometers that each have a plurality of length measuring axes, and besides the rotational amount of wafer stage WST in the θz direction (yawing amount), the rotational amount in the θx direction (pitching amount) and the rotational amount in the θy direction (rolling amount) can also be detected. In addition, the multi-axis interferometer may detect relative information related to the position in the optical axis direction (the Z-axis direction) of projection optical system PL, by irradiating a laser beam on a reflection surface arranged on barrel supporting platform where projection optical system PL is mounted via a reflection surface arranged on a wafer table WTB at an inclination of 45°. On such detection, the relative position in the Z-axis direction of a plurality of points in the XY plane may be detected, and in addition to the positional information of wafer table WTB in the Z-axis direction, inclination information with respect to the XY plane may also be obtained for wafer table WTB.

As is shown in FIG. 1, reticle carrier 28 comprises a carrier main body 74 that has a plurality of housing shelves (such as six shelves) integrally provided for housing reticles in the vertical direction at a predetermined spacing, a cover 76 that fits into carrier main body 74 from above, and a lock mechanism (not shown) provided on the bottom wall of carrier main body 74 that locks cover 76.

Corresponding to the structure of reticle carrier 28, an opening 78, which is slightly larger than carrier main body 74 of reticle carrier 28, is provided in load/unload port 22 where reticle carrier 28 is loaded.

Opening 78 is normally closed with an open/close member 82 that makes up an open/close device 80 shown in FIG. 1. Open/close member 82 comprises a lock operating mechanism (not shown), which engages with the bottom surface of carrier main body 74 of reticle carrier 28 carried into load/unload port 22 by vacuum chucking or mechanical connection, as well as releases the lock mechanism (not shown) provided in carrier main body 74.

Open/close device 80 comprises open/close member 82, a drive shaft 84 whose axis direction is the Z-axis direction and has open/close member 82 fixed on its upper end surface, and a drive mechanism 86 that drives drive shaft 84 in the vertical direction (the Z-axis direction). The lock operating mechanism of open/close member 82 in open/close device 80 releases the lock mechanism, and also after it engages carrier main body 74, it moves open/close member 82 downward by a predetermined amount so that carrier main body 74 holding a plurality of reticles can be detached from cover 76 in a state where the inside of main body chamber 12 is secluded from the outside. This open/close device 80 operates under the control of main controller 50 (refer to FIG. 5).

On the +Y side of open/close device 80 in main body chamber 12, an articulated robot (hereinafter just referred to as 'robot') 88 is disposed. Robot 88 comprises an arm 90 that stretches out and rotates freely within the XY plane, and a drive section 92 for driving arm 90. Robot 88 is mounted on the upper surface of a slider 96, which has a sectional shape in the XZ plane resembling the letter L and vertically moves along a strut guide 94 provided extending in the Z-axis direction. Accordingly, arm 90 of robot 88 can move vertically, in addition to extending/contracting and rotating within the XY plane. Since the structure or the like of robot 88 is the same as a loading unit 39, which will be described later, a detailed description on the structure will be made then. In addition, the vertical movement of slider 96 is driven by a Z-axis liner motor 98 (refer to FIG. 5) consisting of a mover (not shown) provided integrally to slider 96 and a stator (not shown) provided inside strut guide 94 extending in the Z-axis direction.

As is obvious when putting together FIGS. 1 and 2, strut guide 94 is arranged above an X guide 100, which is provided extending in the X-axis direction within main body chamber 12. Strut guide 94 moves along X guide 100 integrally with a slider 102 fixed on its lower surface. That is, a mover (not shown) is provided in slider 102, and a stator (not shown) that makes up an X-axis linear motor 104 (refer to FIG. 5) with the mover is provided in X guide 100. And, X-axis linear motor 104 drives robot 88 in the Y-axis direction, integrally with strut guide 94.

In the embodiment, drive section 92 of robot 88, Z-axis linear motor 98, X-axis linear motor 104, and the like operate under the control of main controller 50 (refer to FIG. 5).

In between robot 88 and exposure apparatus main body 30, reticle carrier system 32 serving as a mask carrier system is arranged. Hereinafter, reticle carrier system 32 will be described in detail, referring to FIGS. 1 to 5.

As is shown in FIG. 1, reticle carrier system 32 is provided on a carrier system supporting frame 75, which is made up of a plurality of support members 23 and a carrier system supporting plate 21 that has a rough L-shaped planar view (when viewed from above) and is supported horizontally by support members 23. As is shown in FIG. 2, an X-axis measuring sensor Sx, which measures the relative position of carrier system supporting plate 21 and reticle base supporting platform 60 in the X-axis direction, and Y-axis measuring sensors Sy1 and Sy2, which measure the relative position in the Y-axis direction, are provided on the side wall of carrier system supporting plate 21 structuring carrier system supporting frame 75 that faces reticle base supporting platform 60. Of these sensors, by using the measurement values of both Y-axis measuring sensors Sy1 and Sy2, the relative position in the rotational direction around the Z-axis can also be measured. The measurement values of each of the measuring sensors are monitored at all times by main controller 50.

As is shown in FIG. 2, reticle carrier system 32 is provided close to the +X side end on carrier system supporting plate 21, and it comprises a loading buffer 25 where the reticles loaded onto reticle stage RST are temporary mounted, a noncontact position measuring unit 45 provided close to the −X side end of loading buffer 25, loading unit 39 that loads the reticles on reticle stage RST, an unloading unit 41 that unloads the reticles from reticle stage RST, and an unloading buffer 43 where the reticles unloaded from reticle stage RST are temporary mounted.

Figure 3:
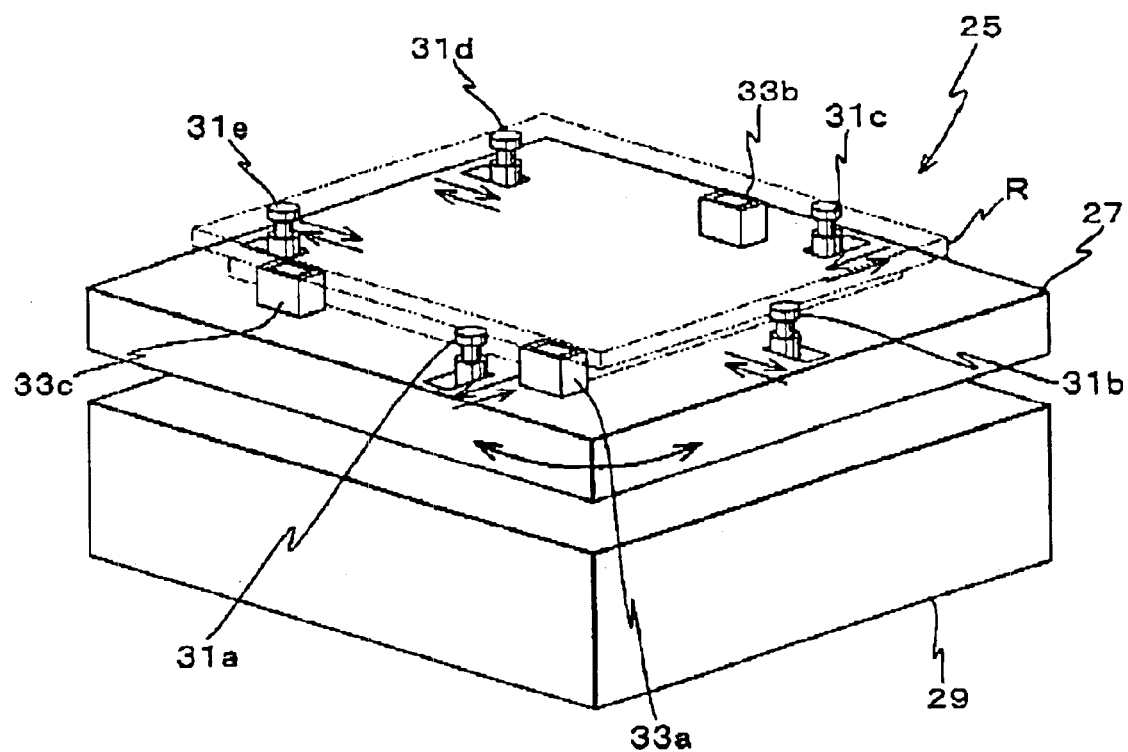
FIG. 3 is a perspective view of a loading buffer extracted.

As is shown in the exploded perspective view in FIG. 3, loading buffer 25 comprises a table 27 that holds reticle R on its upper surface side, and a rotation drive unit 29 that rotationally drives table 27 mainly with a rotational shaft (not shown) joined to the lower surface of table 27 in the center.

As is shown in FIG. 3, in table 27, a contact type reticle positioning unit 131 serving as a positioning unit made up of five positioning pins 31a to 31e (refer to FIG. 5), and three reticle holding members 33a to 33c are provided.

Five positioning pins 31a to 31e that make up contact type reticle positioning unit 131 are each made movable along five grooves formed in table 27. Immediately after reticle R is mounted on reticle holding members 33a to 33c on table 27, all the positioning pins 31a to 31e move to their positions shown in FIG. 3 (positioning position) under the control of main controller 50 (refer to FIG. 5) and are pushed against the edge surfaces of reticle R. That is, in this manner, position of reticle R is mechanically set on reticle holding members 33a to 33c. When this positioning is completed, reticle holding members 33a to 33c hold reticle R by suction, for example, by vacuum chucking. And, after reticle R has been suctioned, all the positioning pins 31a to 31e move from the positions shown in FIG. 3 to positions closer to the outer periphery side of table 27 (positioning releasing positions).

Rotation drive unit 29 includes parts such as a rotary motor, and is structured so that it can rotationally drive table 27 around the Z-axis in at least a range of 90°. With loading buffer 25, when reticle R is mounted on table 27, table 27 waits in the state shown in FIG. 2, and when reticle R is not mounted on table 27, rotation drive unit 29 rotates table 27 from the state shown in FIG. 2 at an angle of 90° in the direction indicated by arrow A, and then table 27 is made to wait in that state.

Noncontact position measuring unit 45 comprises a pair of microscopes 37A and 37B, and an illumination unit 47 that irradiates light from under microscopes 37A and 37B with this noncontact position measuring unit 45, when reticle R is moved to a position in between microscopes 37A and 37B and illumination unit 47 while being held by a loading arm 71 structuring loading unit 39, illumination unit 47 operates under control of main controller 50 and illuminates reticle R from below. With this operation, a pair of alignment marks formed on reticle R (not shown) is observed by microscopes 37A and 37B, and based on the observation results, an alignment controller 93 (refer to FIG. 5) calculates the positional error between the pair of alignment marks (not shown) and the detection center of each of the microscopes 37A and 37B (for example, the center of the imaging scope (observation area)), and the calculation results are sent to main controller 50.

Loading unit 39 is made up of an articulated robot that comprises a loading arm drive section 67, and loading arm 71 driven by loading arm drive section 67 so that it can swivel, extract/contract, and move vertically. The tip of loading arm 71 is made up of a loading hand 59.

Figure 4A:
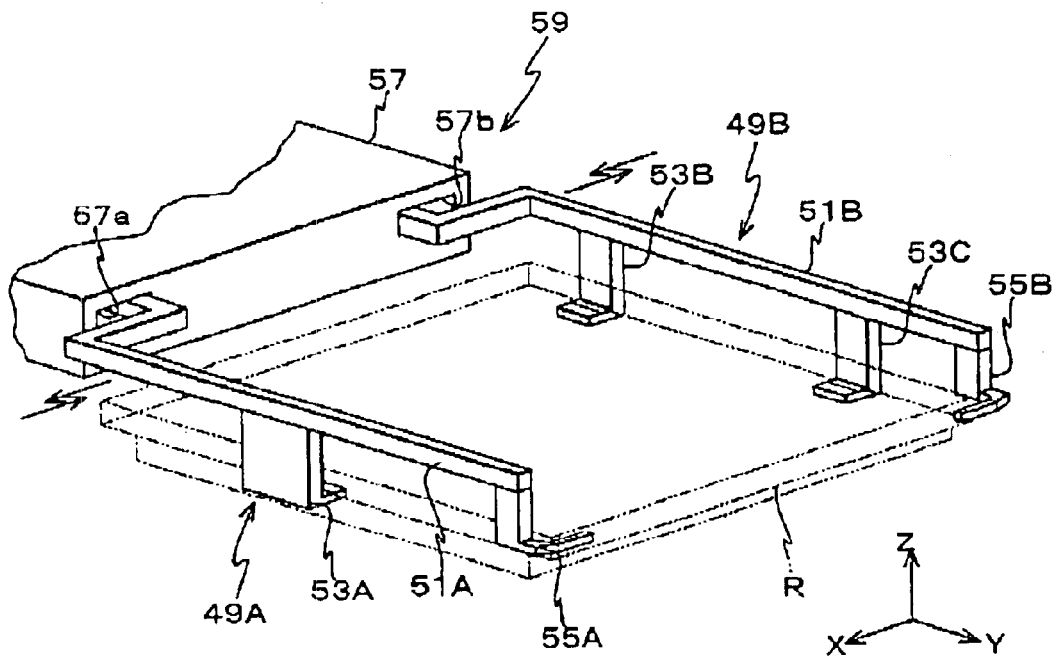
FIG. 4A is a perspective view of a loading hand.

As is shown in the perspective view in FIG. 4A, loading hand 59 comprises a right hand section 49A, a left hand section 49B, and a hand operating mechanism 57 that supports one end of both hand sections 49A and 49B in the longitudinal direction (the Y-axis direction in FIG. 4A) and drives them simultaneously in the open/close direction (opposing directions in the X-axis direction). Right hand section 49A has a hand main body 51A that has the above one end inserted in a groove 57a formed on the edge surface of the housing of hand operating mechanism on the +Y side, a hook section 53A fixed on the lower surface of hand main body 51A near the center in the longitudinal direction, and a stopper 55A fixed to the lower surface on the other end in the longitudinal direction.

Hand main body 51A is made up of a rod shaped member that has a shape bent inward at an angle of 90° at a position to the one end side in the longitudinal direction, and closer to the edge from the above position, the rod shaped member is bent again in the longitudinal direction at an angle of 90°.

Hook section 53A is made up of a member whose sectional shape in the XZ plane resembles the letter L, shaped so that one end (the upper end) is fixed on the lower surface of hand main body 51A, and somewhere near the lower end, the member is bent inward at an angle of 90°. On the upper surface of the lower end of hook section 53A that is bent, a vacuum chuck is provided (not shown).

Stopper 55A is made of an overall rod shaped member whose upper end surface is fixed to the lower surface of hand main body 51A and extends downward for a predetermined length, and in its lower end section an extended section is provided that turns gradually inward and has a smaller cross sectional area than the other parts. The extended section of stopper 55A is located slightly above the section that is bent in hook section 53A.

Left hand section 49B has a hand main body 51B whose shape is symmetrical to hand main body 51A, two hook sections 53B and 53C that are fixed on both ends in the longitudinal direction on the lower surface of hand main body 51B, and a stopper 55B fixed to the lower surface of hand main body 51B on the other end in the longitudinal direction. Hook sections 53D and 53C are symmetrical to hook section 53A. On the upper surfaces of the lower end of hook sections 53B and 53C that are bent, vacuum chucks are provided (not shown), respectively. Stopper 55B has a shape symmetrical to stopper 55A.

According to the loading hand 59 having the structure described above, hand operating mechanism 57 drives both the left and right hands inward at the same time, and in a closed state shown in FIG. 4A where both hand sections 49A and 49B are closed, that is, when right hand section 49A moves over to the −X side in FIG. 4A and left hand section 49B moves to the +X side in FIG. 4A, reticle R is supported from below by the sections bent in hook sections 53A to 53C, and is also held by suction by the vacuum chucks (not shown). In such a state, one edge surface of reticle R (in the case in FIG. 4A, the edge surface on the +Y side) faces stoppers 55A and 55B, and they prevent the position from shifting, and in the worst case, prevent reticle R from falling off.

Referring back to FIG. 2, unloading unit 41 is disposed at a position a predetermined distance away on the −X side and a predetermined distance away on the +Y side from the position where loading unit 39 is disposed. Unloading unit 41 is made up of an articulated robot that comprises an unloading arm drive section 69, and unloading arm 73 driven by unloading arm drive section 69 so that it can swivel, extract/contract, and move vertically.

The tip of unloading arm 73 is made up of an unloading hand 61. As is shown in the perspective view in FIG. 4B, unloading hand 61 comprises a hand operating mechanism 65, a first movable hand section 63B that can be driven back and forth by hand operating mechanism 65 along a direction perpendicular to the longitudinal direction (the X-axis direction in FIG. 4B), and a second movable hand section 63A that can be driven back and forth by hand operating mechanism 65 along the longitudinal direction (the X-axis direction in FIG. 4B).

Figure 4B:
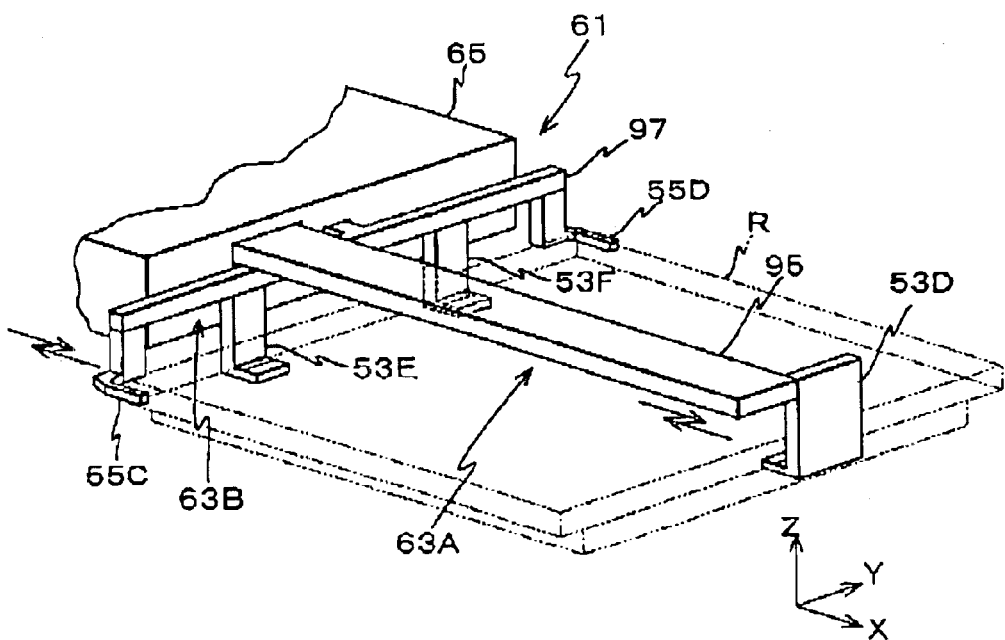
FIG. 4B is a perspective view of an unloading hand.

The first movable hand section 63B comprises a first movable hand main body 97 that has a shape resembling the letter T in a planar view (when viewed from above) with a projected section formed projecting in the −X direction in FIG. 4B, near the center in the longitudinal direction, two hook sections 53E and 53F whose upper end surfaces are fixed to the lower surface of the first movable hand main body 97 on both sides of the center in the longitudinal direction, having the same structure as hook sections 53A to 53C previously described, and stoppers 55C and 55D that are provided on the lower surface of the first movable hand main body 97 on both ends in the perpendicular direction and have the same structure as stoppers 55A and 55B. The sections that are bent on the lower end of hook sections 53E and 53F face the opposite side of hand operating mechanism 65. The projected section of the first movable hand main body 97 is inserted into the housing of hand operating mechanism 65, which drives the first movable hand main body 97 along the X-axis direction in FIG. 4B.

The second movable hand section 63A comprises a slide bar 95 that has one end in the longitudinal direction (the direction perpendicular to the longitudinal direction in the first movable hand main body 97) inserted into the housing of hand operating mechanism 65 and is drivable along the longitudinal direction, and a hook section 53D provided on the other end (the end on the +X side in FIG. 4B) in the longitudinal direction of slide bar 95. Hook section 53D has the same structure as the previous hook sections 53A to 53C, and the section that is bent on the lower end faces hook sections 53E and 53F.

According to the unloading hand 61 having the structure described above, hand operating mechanism 65 drives the first and second movable hand sections 63B and 63A inward, and in a closed state shown in FIG. 4B where the first and second movable hand sections 63B and 63A are closed, that is, when the first movable hand section 63B moves over to the +X side in FIG. 45 and the second movable hand section 63A moves to the −X side in FIG. 4B, reticle R is supported from below by the sections bent in hook sections 53D to 53F, and is also held by suction by the vacuum chucks (not shown). In such a state, surfaces on both sides of reticle R (in the case in FIG. 4B, the edge surfaces on both the −Y side and the +Y side) face stoppers 55C and 55D, and they prevent the position from shifting, and in the worst case, prevent reticle R from falling off.

Referring back to FIG. 2, unloading buffer 43 is disposed at a position a predetermined distance away on the −Y side from the position where unloading unit 41 is disposed, where the reticles carried from reticle stage RST by unloading unit 41 are temporarily mounted. This unloading buffer 43 is structured including, for example, a rotary table, and reticle holding members (not shown) provided on the rotary table that are similar to reticle holding members 33a to 33c provided in loading buffer 25 referred to earlier.

FIG. 5 briefly shows an arrangement of a control system of exposure apparatus 10 in the embodiment. The control system is structured, centering on main controller 50 serving as a control unit consisting of a workstation (or a microcomputer). Besides the various controls performed by main controller 50 that have been described so far, main controller 50 also has overall control over the entire apparatus.

Next, a series of operations related to the loading and unloading of reticles to reticle stage RST by reticle carrier system 32 or the like (reticle exchange) will be described, referring to drawings such as FIGS. 1, 2, 6, and 7.

As a premise, a reticle R' is mounted on reticle stage RST, and in exposure apparatus main body 30, exposure operation is to be performed, that is, the circuit pattern formed on reticle R' is to be sequentially transferred onto a plurality of shot areas on wafer W1 or W2 in a step-and-scan method. The exposure operation based on the step-and-scan method is to be performed in the same manner as in a typical scanning stepper.

During the above exposure operation, preparatory operations for exchanging the reticle is performed in a predetermined procedure, and loading hand 59 at the tip of loading arm 71 that make up loading unit 39 holds reticle R which is to be used in the next exposure, carries reticle R to a loading waiting position above the loading position which will be described later, and then waits at that position. In addition, unloading hand 61 of unloading unit 41 is to be waiting at the unloading waiting position above the unloading position.

The above preparatory operations for reticle exchange follow the procedures a. to h. described below.

When preparatory operations for reticle exchange begins, table 27 of loading buffer 25 faces the direction shown in FIG. 2, and reticle R is held by suction on reticle holding members 33a to 33c provided on table 27. At this point, positioning of reticle R has been mechanically performed on reticle holding members 33a to 33c by the five positioning pins 31a to 31e that make up contact type reticle positioning unit 131 described earlier in the description, and the positioning pins 31a to 31e are already withdrawn to their positioning releasing positions.

a. First of all, main controller 50 swivels and expands/contracts loading arm 71 of loading unit 39 via loading arm drive section 67 so that loading hand 59 of loading unit 39 is located above loading buffer 25. With this operation, preparatory operations for reticle exchange begin.

b. Next, main controller 50 drives loading arm 71 downward via loading arm drive section 67 so that left hand section 49B and right hand section 49A of loading hand 59 are positioned below reticle R held on reticle holding members 33a to 33c with both hand sections located on the outer side of reticle R.

c. Next, main controller 50 performs the closing operation of both hand sections 49A and 49B via hand operating mechanism 57 that has been described earlier, and at the same time releases the suction of reticle R by reticle holding members 33a to 33c.

d. Next, main controller 50 begins the vacuum chucking by the vacuum chucks (not shown) respectively provided on hook sections 53A to 53C of loading hand 59, and also drives loading arm 71 upward by a predetermined amount. When reticle R is supported from below by hook sections 53A to 53C of loading hand 59 during the upward movement, reticle R is held by suction at the same time. Then, when loading arm 71 moves further upward, reticle R is separated from loading buffer 25 while being held by hook sections 53A to 53C, thus reticle R is unloaded from loading buffer 25.

e. When main controller 50 confirms that reticle R has been unloaded from loading buffer 25, it then rotationally drives table 27 of loading buffer 25 via rotation drive unit 29 at an angle of 90° in a direction A indicated by an arrow in FIG. 2. Then, table 27 waits in the above state until robot 88 brings the next reticle.

f. In parallel with the operation e. described above, main controller 50 slightly contracts loading arm 71 of loading unit 39 so that reticle R held by loading hand 59 is positioned below microscopes 37A and 37B that make up noncontact position measuring unit 45 (the state shown in FIG. 1). The position of loading hand 59 at this point (including the rotation within the XY plane) is measured with a measuring unit (not shown), and the measurement results are stored in memory (not shown) within main controller 50. Then, main controller 50 detects the positional error between the pair of alignment marks formed on reticle R (not shown) and the detection center of each of the microscopes 37A and 373 (for example, the center of the imaging scope (observation area)) via noncontact position measuring unit 45. The results of this detection are stored in memory within main controller 50. Then, based on the above measurement results and detection results, main controller 50 obtains information on the positional relation (including rotation) between loading hand 59 and reticle R, and the relative positional information is stored in memory.

g. Then, main controller 50 swivels and expands/contracts loading arm 71 via loading arm drive section 67 so as to move loading hand 59 that holds reticle R to the loading waiting position shown in FIG. 2 above the loading position, which is above reticle base supporting platform 60. Then, loading hand 59 waits at this position.

h. In parallel with any of the above operations a. to g., main controller 50 swivels and expands/contracts unloading arm 73 via unloading arm drive section 69 so as to move unloading hand 61 to the unloading waiting position shown in FIG. 2 above the unloading position. Then, unloading hand 61 waits at this position.

Meanwhile, when exposure operation using reticle R' mounted on reticle stage RST is completed, main controller 50 moves reticle stage RST holding reticle R' from the position where exposure has been completed in the −Y direction toward the reticle unloading position. Main controller 50 performs this movement of reticle stage RST, by controlling reticle stage drive system 62 based on the measurement values of reticle interferometer 64.

Figure 6A:
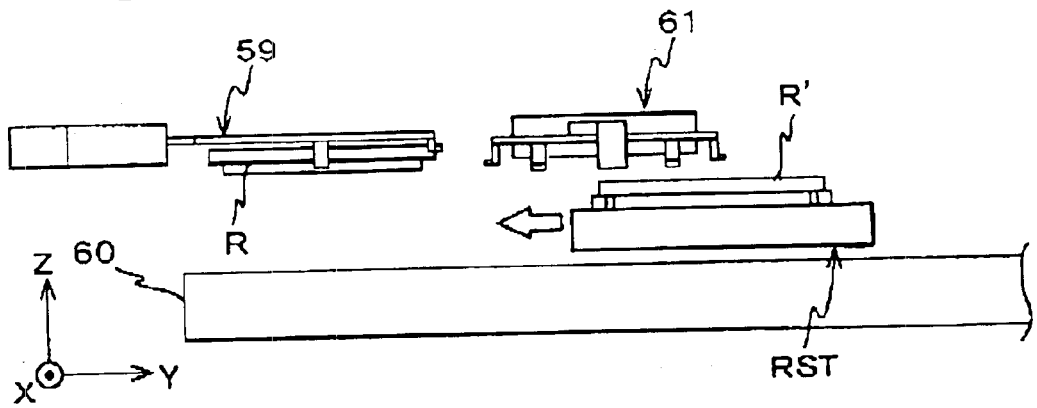
FIGS. 6A to 6C are views ($1^{st}$ version) for describing a method of loading and unloading a reticle with respect to a reticle stage.
Figure 6B:
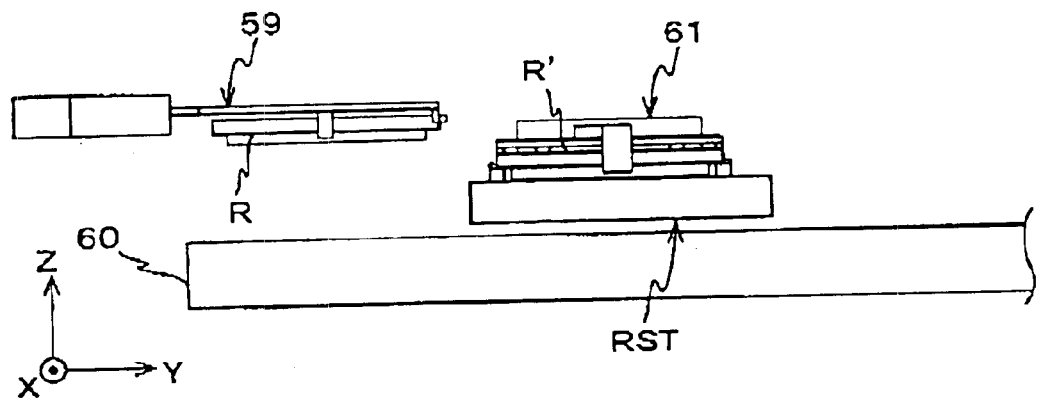
Figure 6C:
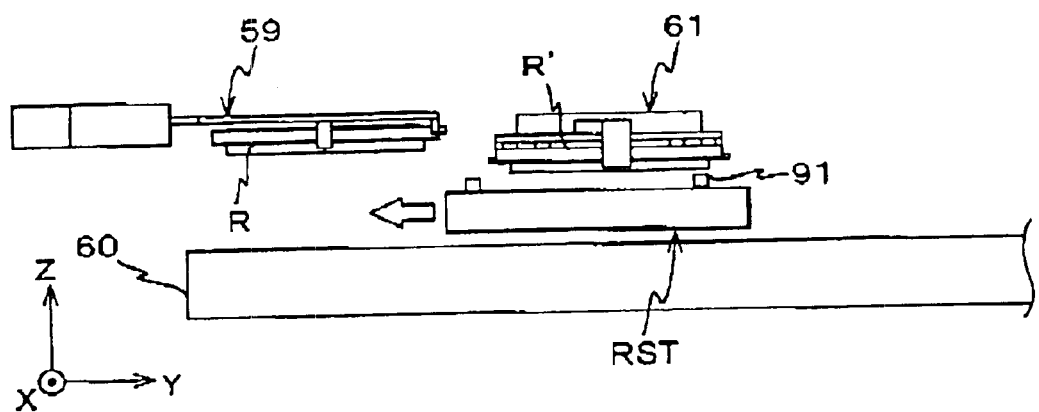
Figure 7A:
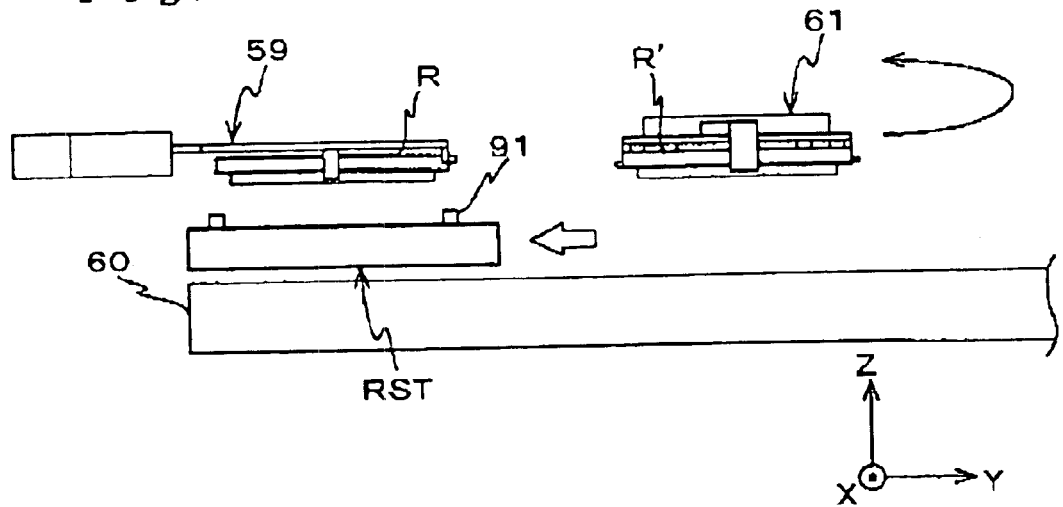
FIGS. 7A to 7C are views ($2^{nd}$ version) for describing a method of loading and unloading a reticle with respect to a reticle stage.

FIG. 6A shows the state of reticle stage RST while it is being moved. When reticle stage RST moves further in the −Y direction from the stage in FIG. 6A, and is positioned at the unloading position shown in FIG. 2, reticle exchange is then performed, in the procedures i. to o., described below.

i. First of all, main controller 50 drives unloading hand 61 (unloading arm 73) waiting at the unloading waiting position downward a predetermined amount via unloading arm drive section 69, and then begins the closing operation of the first and second movable hand sections 63B and 63A via hand operating mechanism 65 and the vacuum chucking operation by the vacuum chucks (not shown) provided in hook sections 53D to 53F. Prior to these operations, main controller 50 has released the suction of reticle R' to reticle stage RST.

j. Next, main controller 50 drives unloading arm 73 upward a predetermined amount. With this operation, unloading hand 61 is driven upward, and during this upward movement, reticle R' is supported from below by hook sections 53D to 53F of unloading hand 61 and vacuum chucked at the same time. Then, when unloading hand 61 moves slightly upward, reticle R' is separated from reticle stage RST by unloading hand 61, and is delivered to unloading hand 61 from reticle stage RST. FIG. 6B shows the state when the delivery of reticle R' is about to be performed. Then, unloading hand 61 is driven slightly upward by main controller 50, and then withdrawn from above reticle stage RST, and is moved toward unloading buffer 43. That is, reticle R' is unloaded from reticle stage RST in the manner described above.

k. When unloading hand 61 moves upward to a position where it does not interfere with the movement of reticle stage RST moving in the −Y direction as is shown in FIG. 6C, main controller 50 drives reticle stage RST in the −Y direction a predetermined amount in order to position it at the loading position. FIG. 7A shows a state of reticle stage RST that has been driven in this manner and is positioned at the loading position below loading hand 59, which is waiting at the loading waiting position. At this point, unloading hand 61 is being driven toward unloading buffer 43 while holding reticle R', after being withdrawn from above reticle stage RST by main controller 50.

l. Then, when reticle stage RST is positioned at the reticle loading position, main controller 50 begins the vacuum chucking by the vacuum chucks (not shown) provided in a holder 91 projecting on the upper surface of reticle stage RST, and at the same time drives loading hand 59 downward a predetermined amount via loading arm drive section 67 while controlling the position and rotation of loading hand 59 so that reticle R is mounted on reticle stage RST without being displaced, based on the measurement results of non-contact position measuring unit 45 referred to earlier stored in memory (relative positional information between loading hand 59 and reticle R) and the measurement results of sensors Sx, Sy1, and Sy2 (relative positional information between carrier system supporting plate 21 and reticle base supporting platform 60). While loading hand 59 is being driven downward, the lower surface of reticle R being held by loading hand 59 (the surface on the side where the pattern is formed) is pushed into holder 91 provided on the upper surface of reticle stage RST. Therefore, prior to this, main controller 50 releases the suction of reticle R by hook sections 53D to 53F of loading hand 59.

Figure 7B:
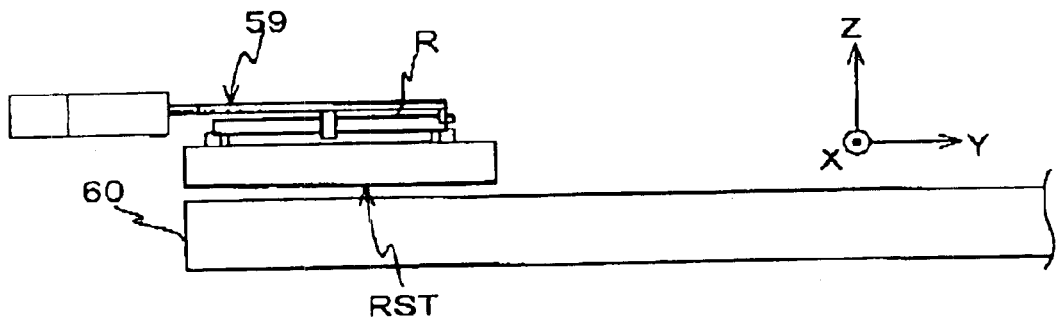
Figure 7C:
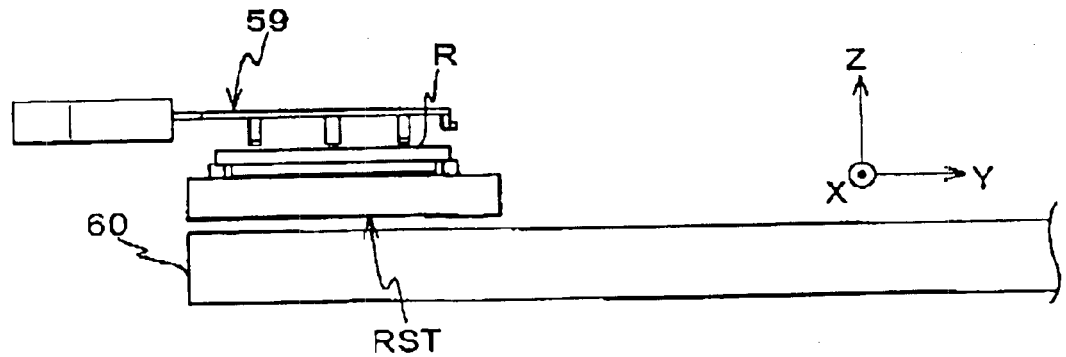

When loading hand 59 that holds reticle R moves slightly lower than the position where the lower surface of reticle R came into contact with holder 91 in the manner above, reticle R is delivered onto reticle stage RST from loading hand 59. FIG. 7B shows the state of reticle R, which is just about to be delivered.

m. After the delivery of reticle R described above has been performed, as is shown in FIG. 7C, main controller 50 performs the opening operation of both hand sections 49B and 49A of loading hand 59 and moves loading arm 71 upward. With these operations, loading operation of reticle R onto reticle stage RST is completed, and main controller 50 begins to move loading hand 59 toward loading buffer 25 in order to load the next reticle onto reticle stage RST.

n. In parallel with a part of the above l. and m. operations, main controller 50 moves unloading hand 61 to a position above unloading buffer 43 indicated by an imaginary line (double-dotted line) in FIG. 2. Then, main controller 50 drives unloading hand 61 located above unloading buffer 43 downward via unloading arm drive section 69, and during this movement, main controller 50 releases reticle R' from the suction by unloading hand 61. Then, when unloading hand 61 has been moved downward by a predetermined amount, reticle R' is pushed into the reticle holding members of unloading buffer 43, and by driving unloading hand 61 further downward, reticle R' is delivered to the reticle holding members.

o. Then, main controller 50 performs the opening operation of the first and second movable hand sections 63B and 63A via hand operating mechanism 65, and then moves unloading hand 61 again toward the reticle unloading position. Incidentally, after reticle R' is delivered to the reticle holding members, it is carried to reticle carrier 28.

In the above description, at the point where preparatory operations for reticle exchange begins, reticle R was already available on table 27 of loading buffer 25, however, in prior to this, reticle R has to be carried from reticle carrier 28, which has been carried into load/unload port 22, onto loading buffer 25.

Hereinafter, a procedure of carrying reticle R will be briefly described.

First of all, for example, when OHV26 shown in FIG. 1 carries reticle carrier 28 in which a plurality of reticles (such as 6) are housed into load/unload port 22, main controller 50 confirms the loading of reticle carrier 28 into load/unload port 22, drives drive shaft 84 upward via drive mechanism 86 that structures open/close device 80, and engages open/close member 82 with carrier main body 74 of reticle carrier 28 as well as releases the lock mechanism or reticle carrier 28 with the lock operating mechanism. Then, main controller 50 drives drive shaft 84 downward a predetermined amount via drive mechanism 86. With this operation, open/close member 82 engaged with carrier main body 74 moves downward a predetermined amount integrally with drive shaft 84, and carrier main body 74 holding the plurality of reticles is detached from cover 76 in a state where the inside of main body chamber 12 is secluded from the outside. FIG. 1 shows a state where carrier main body 74 is detached from cover 76. At this point, robot 88 is waiting at a position substantially facing open/close device 80. Accordingly, hereinafter, it is possible to carry the reticles in the reticle carrier on loading buffer 25.

When carrying reticles in the reticle carrier onto loading buffer 25, main controller 50 first of all inserts arm 90 via drive section 92 of robot 88, for example, under reticle R held in the bottom shelf of carrier main body 74, and then drives robot 88 slightly upward, while at the same time starting the vacuum chucking by the vacuum chucks in arm 90. With this operation, arm 90 supports reticle R from below and holds it by suction.

Next, main controller 50 contracts arm 90 via drive section 92 and takes out reticle R from carrier main body 74, and then drives robot 88 upward until it reaches a position near the position indicated by an imaginary line 88' in FIG. 1. At this stage, since there are no reticles mounted on loading buffer 25, loading buffer 25 is waiting at a position rotated in the direction indicated by arrow A at an angle of 90° from the state shown in FIG. 2.

Therefore, main controller 50 moves arm 90 of robot 88 holding reticle R above the waiting loading buffer 25, and then drives arm 90 downward a predetermined amount. During this movement, reticle R will be delivered to loading buffer 25, and prior to this, main controller 50 releases the suction of reticle R by arm 90. Then, when arm 90 has been lowered a predetermined amount and reticle R has been delivered from arm 90 onto reticle holding members 33a to 33c on table 27, main controller 50 performs the opening operation of both hands on the tip of arm 90 of robot 88 and then withdraws robot 88 from loading buffer 25. Then, under the control of main controller 50, table 27 is rotated at an angle 90° in the direction indicated by arrow B in FIG. 2 and mechanical positioning by positioning pins 31a to 31e are performed.

Meanwhile, when loading the reticle that is to be used after reticle R in the next exposure and still further the next reticle to be used on reticle stage RST, reticle R needs to be unloaded onto unloading buffer 43, and in order to do so, reticle R' has to be returned into carrier main body 74 in advance. Therefore, main controller 50 carries reticle R' that has been used from unloading buffer 43 in a substantially reversed procedure of the procedure for carrying reticles to loading buffer 25 using robot 88 described above, and places the reticle in the housing shelf of carrier main body 74 where there are no reticles.

With exposure apparatus 10 in the embodiment, reticle exchange is performed in the manner described above, and on reticle exchange, reticle R is loaded on reticle stage RST. Following are the operations that are performed after such loading.

More particularly, as soon as reticle R has been loaded (immediately after the state shown in FIG. 7C), main controller 50 drives reticle stage RST in the +Y direction and moves it so that it is position above projection optical system PL.

Next, main controller 50 sets various exposure conditions for performing scanning exposure with an appropriate exposure amount (target exposure amount) of each shot area on wafer W1, which is mounted on either of the wafer stages (for example, wafer stage WST1), according to instructions from an operator.

Next, main controller 50 detects both the alignment marks of wafer W1 and the fiducial marks on wafer stage WST1 using, for example, alignment system ALG1, moves wafer stage WST1 to the exposure position from the alignment position, and then detects the marks of reticle R (or the fiducial marks on reticle stage RST) and the fiducial marks on wafer stage WST1 using a reticle alignment system (not shown), via projection optical system PL. On detection, fine alignment of wafer W1 is performed based on, for example, an EGA method (Enhanced Global Alignment). That is, based on the measurement results of alignment system ALG1 (positional information of each mark on an orthogonal coordinate system (an alignment coordinate system), which is set by X-axis interferometer 77 (especially the length measuring axis orthogonal to the optical axis of alignment system ALG1) and Y-axis interferometer 72) and the measurement results of the reticle alignment system (positional information on an orthogonal coordinate system (an exposure coordinate system), which is set by X-axis interferometer 77 (especially the length measuring axis orthogonal to the optical axis of projection optical system PL) and Y-axis interferometer 72), arrangement coordinates of all the areas where the pattern of reticle R is to be transferred are calculated. In the embodiment, the arrangement coordinates of each shot area on the alignment coordinate system obtained by the EGA method are corrected using the measurement results of the reticle alignment system, that is, they are converted to arrangement coordinates on the exposure coordinate system. The arrangement coordinates of each shot area, however, may also be calculated by the EGA method, based on the coordinates of each mark on the exposure coordinate system that are obtained by correcting the measurement results of alignment system ALG1 using the measurement results of the reticle alignment system.

Details on the reticle alignment system and reticle alignment using the system are disclosed in, for example, Japanese Patent Application Laid-open No. H07-176468 and the corresponding U.S. Pat. No. 5,646,413. In addition, details on EGA that follows reticle alignment are disclosed in, for example, Japanese Patent Application Laid-open No. S61-44429 and the corresponding U.S. Pat. No. 4,780,617. As long as the national laws in designated states or elected states, to which this international application is applied, permit, the above disclosures of the Japanese Patent Application and the U.S. Patent are incorporated herein by reference.

When preparatory operations for exposing wafer W1 are completed in the manner above, main controller 50 proceeds with wafer exchange on the other stage WST2 and fine alignment using alignment system ALG2, and then puts wafer stage WST2 in waiting.

Then, when pattern transfer on wafer W1 on wafer stage WST1 is completed, main controller 50 moves wafer stage WST1 to the wafer exchanging position and also moves wafer stage WST2 so that it is positioned under projection optical system PL and exposure of wafer W2 on wafer stage WST2 is performed. As a matter of course, during the exposure, wafer exchange and wafer alignment is being performed on wafer stage WST1.

Details on the parallel processing similar to the ones performed in the embodiment on the two wafer stages are disclosed in, for example, Japanese Patent Application Laid-open No. H10-214783 and the corresponding U.S. Pat. No. 6,341,007. As long as the national laws in designated states or elected states, to which this international application is applied, permit, the above disclosures of the Japanese Patent Application and the U.S. Patent are incorporated herein by reference.

Then, when reticle exchange becomes necessary, the preparatory operations for reticle exchange previously described are performed under projection optical system PL in the manner described above, in parallel with the continuous exposure operation performed on the wafer.

As is obvious from the description so far, in the embodiment, main controller 50 structures a control unit and a stage control unit. However, the present invention is not limited to this, and the control unit and the stage control unit may be structured of a controller provided separately from main controller 50, or furthermore, they may naturally be structured from separate hardware.

As is described in the description above, with exposure apparatus 10 in the embodiment, reticle carrier system 32 is mounted on carrier system supporting frame 75, which is separate from main body 36 structuring exposure apparatus main body 30 where reticle stage RST is mounted and pattern transfer (exposure) is performed, and reticle carrier system 32 performs loading of reticles onto reticle stage RST, as well as unloading of reticle from reticle stage RST. Therefore, even when reticle carrier system 32 performs the preparatory operations for reticle exchange that has been previously described while the pattern transferring operation, or in other words, exposure is being performed on the exposure apparatus main body 30 side including main body 36, there are no risks for the operation of reticle carrier system 32 to become the cause of vibration in main body 36. Accordingly, by the parallel processing of the exposure operation and the preparatory operations for reticle exchange, throughput can be improved while maintaining the pattern exposure accuracy, or in other words, the exposure accuracy, compared with when exposure operation and reticle exchange operation are sequentially performed.

In addition, with exposure apparatus 10 in the embodiment, measuring sensors Sx, Sy1, and S2 for measuring the relative position between main body 36 and carrier system supporting frame 75 and noncontact position measuring unit 45 for measuring the relative position (including θz rotation) between the reticle and loading arm 71 (or to be more accurate, loading hand 59) in a noncontact manner while the reticle is being loaded onto reticle stage RST are provided. And main controller 50 adjusts the positional relationship between the reticle stage and the reticle when loading the reticle onto reticle stage RST, taking into consideration the measurement results of measuring sensors Sx, Sy1, and S2, and the measurement results of noncontact position measuring unit 45.

That is, because reticle carrier system 32 and main body 36 are made separate in order to prevent the operation of reticle carrier system 32 become the cause of vibration in main body 36, there may be cases when the positional relationship between main body 36 and carrier system supporting frame 75 change. However, in the embodiment, as is described above, because main controller 50 adjusts the positional relationship between the reticle stage and the reticle when loading the reticle on reticle stage RST, taking into consideration the measurement results of measuring sensors Sx, Sy1, and S2, and the measurement results of noncontact position measuring unit 45, the reticle can be loaded on a desired position on reticle stage RST without being affected by the change in the positional relationship between main body 36 and carrier system supporting frame 75, and moreover, the reticle can be loaded onto a desired position on reticle stage RST without displacement, based on the measurement of noncontact position measuring unit 45 on the relative position between the reticle and loading arm 71 (or to be more accurate, loading hand 59), or in other words, the pre-alignment results of the reticle. In addition, because the reticle is loaded directly on reticle stage RST after the pre-alignment of the reticle by noncontact position measuring unit 45, that is, the reticle is delivered only once after pre-alignment, displacement of the reticle that occurs on delivery of the reticle can be effectively suppressed. Accordingly, the displacement that occurs between reticle and reticle stage RST when loading the reticle onto the reticle stage can almost completely be resolved.

In addition, with exposure apparatus 10 in the embodiment, reticle carrier system 32 comprises loading arm 71 used only for loading the reticle on reticle stage RST, and independent from loading arm 71, it also comprises unloading arm 73 used only for unloading the reticle from reticle stage RST. And, on reticle exchange, the following exchange sequence is executed under the control of main controller 50. More particularly, when reticle stage RST holding the reticle is at the predetermined unloading position, unloading arm 73 separates the reticle from reticle stage RST, and at some point after the separation, such as the instant the reticle is separated or immediately after, reticle stage RST is moved from the unloading position to the predetermined loading position, and at the loading position, loading arm 71 loads the reticle on reticle stage RST in prior to the complete withdrawal of unloading arm from the unloading position. Accordingly, the downtime in between the unloading of the reticle from reticle stage RST by unloading arm 73 and the loading of the reticle by loading arm 71 (corresponds to the conventional waiting time previously described) is reduced, which reduces the time required for reticle exchange, and also from this viewpoint, the throughput can be improved.

Furthermore, with exposure apparatus 10 in the embodiment, coupled with the above various effects, the simultaneous parallel processing executed on the two wafer stages WST1 and WST2 allows high throughput to be achieved.

In the above embodiment, the case has been described where the exposure apparatus comprises both measuring sensors Sx, Sy1, and S2 for measuring the relative position between main body 36 and carrier system supporting frame 75 and noncontact position measuring unit 45 for measuring the relative position (including θz rotation) between the reticle and loading arm 71 in a noncontact manner, however, the present invention is not limited to this. That is, the exposure apparatus in the present invention may comprise only the measuring sensors for measuring the relative position between main body 36 and carrier system supporting frame 75. Even in such a case, with the control unit adjusting the positional relationship of the mask (reticle) and mask stage upon loading, taking into consideration the measurement values of the measuring sensors, the mask carrier system and the main body can be separated to prevent the operation of the mask carrier system from being the cause of vibration in the main body, and the loading of the mask onto the mask stage can also be performed with good accuracy without being affected by the change in the positional relationship between the main body and mask carrier system. In the case the change in the positional relationship between the main body and mask carrier system is to be corrected later on, the measuring sensors do not have to be provided. Even in such a case, it is possible to prevent the operation of the mask carrier system from being the cause of vibration in the main body; therefore, preparatory operations for mask exchange can be performed during exposure.

Or, the exposure apparatus in the present invention may only comprise the above noncontact position measuring unit without comprising the measuring sensors. Even in such a case, because the number of deliveries of the mask after pre-alignment is reduced, the displacement that occurs due to delivery can be effectively suppressed.

In addition, in the above embodiment, the case has been described where reticle carrier system 32 comprises both loading arm 71 and unloading arm 73, however, the present invention is not limited to this. For example, the mask carrier system may comprise a carrier arm that performs both loading and unloading. Even in such a case, by separating the main body and the carrier system supporting frame, it is possible to prevent the operation of the mask carrier system from being the cause of vibration in the main body, and to also perform preparatory operations for mask exchange in parallel with the exposure operation.

In addition, in the above embodiment, the case has been described where the main body and carrier system supporting frame are arranged separately, however, the present invention is not limited to this, and the mask carrier system may be mounted on the main body. Even in such a case, by employing the mask exchange sequence described above where the unloading arm separates a mask from the mask stage when the mask stage holding the mask is at the unloading position, and at the same time or immediately after the separation, the mask stage moves from the unloading position to the loading position and at the loading position the loading arm loads a mask on the mask stage, the downtime between the unloading of the mask from the mask stage by the unloading arm and the loading of the mask by the loading arm can be reduced, therefore, the time required for mask exchange can be reduced.

In addition, even in the case where the mask carrier system is mounted on the main body, if the exposure apparatus comprises the above noncontact position measuring unit, the number of deliveries of the mask after pre-alignment is reduced, therefore, the displacement that occurs due to delivery can be effectively suppressed.

In addition, in the above embodiment, as the loading arm and unloading arm, the arm of an articulated robot has been used. This is because parts such as the loading buffer, the unloading buffer, and the reticle stage can be arranged at any position as long as it is within the moving range of the arm, and the result of taking into consideration such flexibility in arrangement. However, depending on the layout of each section in the mask carrier system, for example, a straight movement type carrier system that moves along one direction within a horizontal plane and also movable in the vertical direction may be used, or an articulated robot and a straight movement type carrier system may be used together.

In the above embodiment, when the reticle is loaded on reticle stage RST or the reticle is unloaded from reticle stage RST, the loading arm or the unloading arm is moved vertically. The present invention, however, is not limited to this, and in order to deliver the reticle, the section on which the reticle is mounted on reticle stage RST and the arms may both move relatively in the vertical direction. That is, the section actually performing the vertical movement may either be the reticle stage or the arms. In this case, not only may the reticle stage itself move vertically, but also, for example, the reticle holder of the reticle stage may be moved vertically.

Furthermore, when reticle R is mounted on reticle stage RST, the displacement of reticle R is controlled by controlling the position and rotation of loading hand 59, however, instead of or combined with loading hand 59, at least either the position or rotation of reticle stage RST may be controlled.

In addition, in the above embodiment, the case has been described where the exposure apparatus comprises the loading buffer and unloading buffer separately. The present invention, however, is not limited to this, and a buffer that can stock a plurality of reticles that can be taken in and out can be used as a common buffer for loading/unloading. As a matter of course, the loading buffer and the unloading buffer may each be buffers that can stock a plurality of reticles. Furthermore, in FIGS. 1 and 2, a storage shelf the can house a plurality of reticles may be arranged in between carrier main body 74 and reticle stage RST (loading buffer 25 or unloading buffer 43), and in this case, the reticles housed in a plurality of reticle carriers 28 can all be stored together in the storage shelf. Therefore, for example, in a device manufacturing process that requires usage of reticles exceeding the number of reticles that can be housed in a single reticle carrier, by storing the required number of reticles in the storage shelf all together, the time required for reticle exchange can be reduced, and the throughput can be improved.

In the above embodiment, the case has been described where a SMIF multi-pod (that houses six reticles) is used as the reticle carrier. The present invention, however, is not limited to this, and a single pod (houses one reticle), or a front opening unified pod (FOUP) type reticle carrier (mask container) may also be used.

In addition, the carrier system that carries the reticles in the above embodiment is a mere example, and the present invention is not limited to this and can employ any arrangement. For example, a carrier system that carries the reticles in between carrier main body 74 (or the storage shelf described earlier) and reticle stage RST may be employed without robot 88 and loading buffer 25 being provided. In addition, the OHV does not necessarily have to be used, and the operator can perform the reticle exchange manually. In addition, contact type reticle positioning unit 131 does not have to be provided in loading buffer 25.

In addition, in the above embodiment, the case has been described where the exposure apparatus comprises a single reticle stage, however, the exposure apparatus in the present invention may comprise two reticle (mask) stages that are movable independently. In such a case, reticle (mask) carrier system 32 may be provided in each retile stage. In such a case, the loading position and unloading position for each reticles stage are preferably set on the opposite sides in the scanning direction via the projection optical system. With this arrangement, by performing the preparatory operations for reticle stage with one of the carrier system during the exposure operation, reticle exchange can be performed smoothly to either of the reticle stages as soon as the exposure operation is completed in the exchanging sequence previously described. In addition, in the case an appropriate reaction force cancel mechanism is employed together in order to prevent the movement operation of one reticle stage to be the cause of vibration in the other stage or in the main body, it becomes possible to perform the reticle exchange previously described on the other stage, while the exposure operation is being performed on one stage.

In addition, in the description of the above embodiment, although there were no specific references, in the case where a reticle stage is used that can have only one reticle mounted at a time, as in reticle stage RST, depending on the setting of the distance between the position above projection optical system PL where exposure is performed and the loading/unloading position where reticle exchange is performed, or on the setting of the distance between the unloading position and loading position, the interferometer measuring the position of reticle stage RST in the non-scanning direction may require a change over when the reticle stage is moving in between the above positions, and in exposure apparatus 10 in the above embodiment, exposure apparatus 10 preferably has an arrangement where such change over in the interferometer is performed by main controller 50. However, when such an arrangement is employed, an interferometer system for measuring the position of the reticle stage has to be newly built, and the arrangement of the control system becomes complicated due to the above change over in the interferometer. The following second embodiment was made, from reviewing such points.

Second Embodiment

Figure 8:
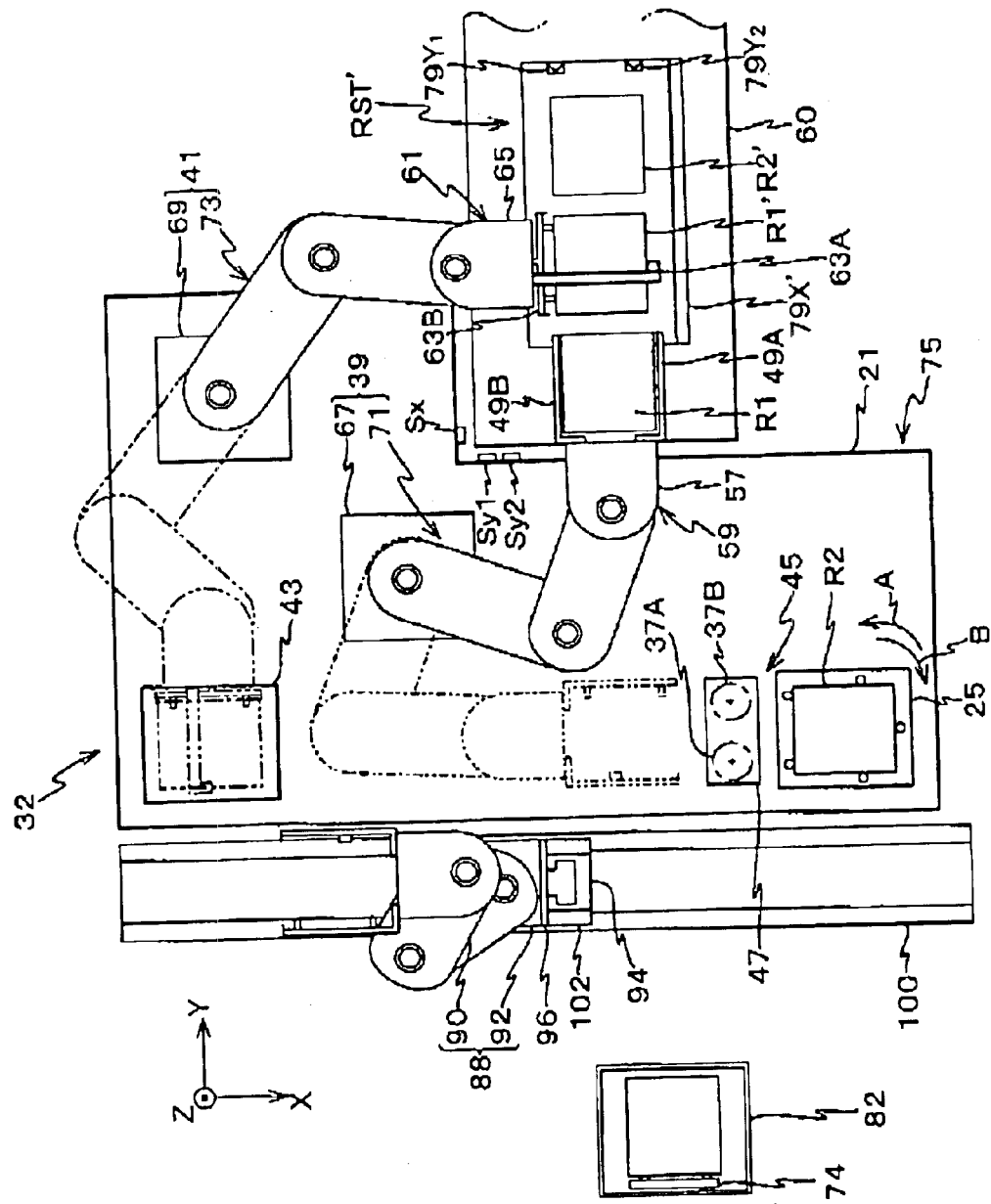
FIG. 8 is a planar view of a reticle stage and a reticle carrier system in an exposure apparatus related to a second embodiment in the present invention.
Figure 9:
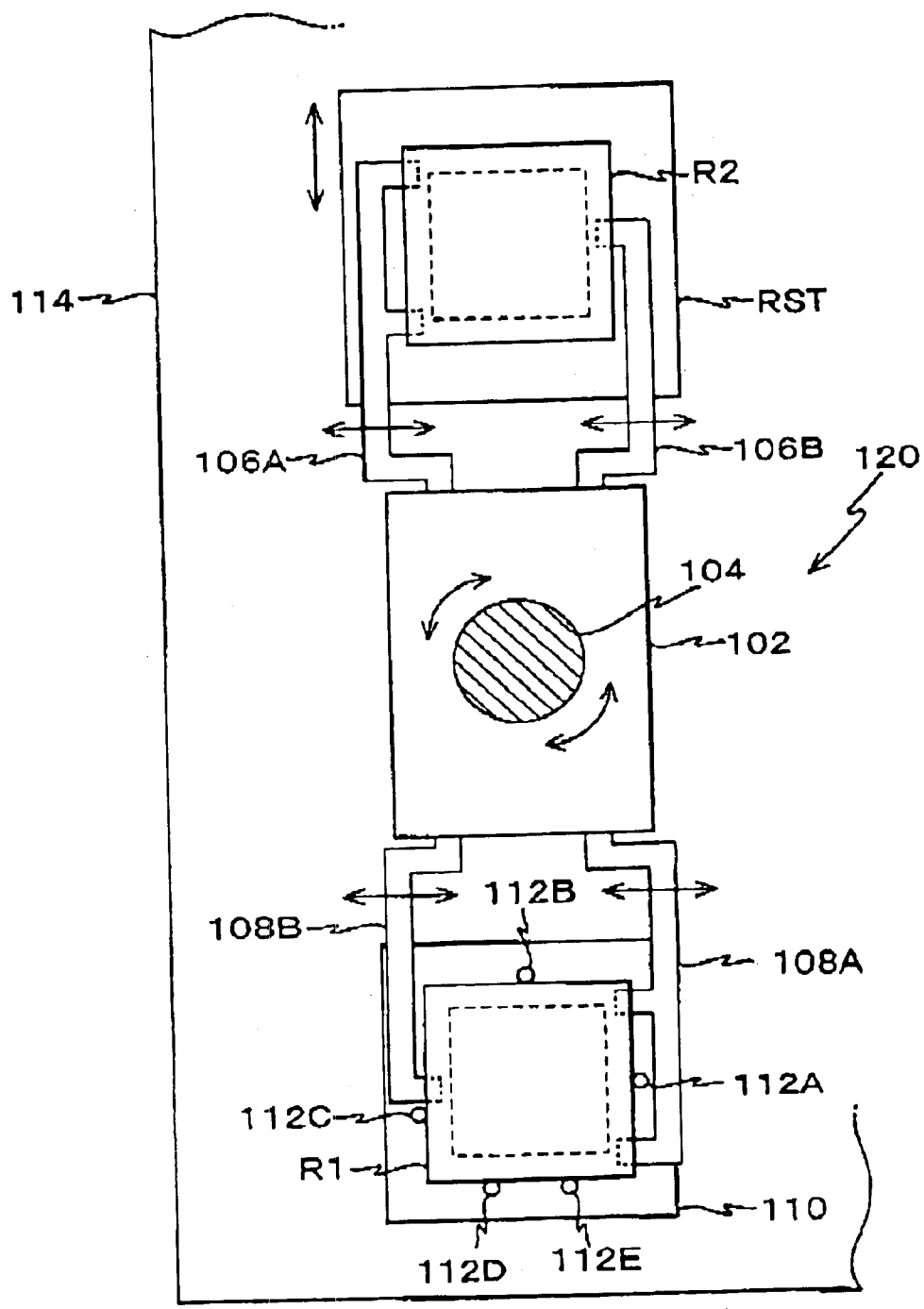
FIG. 9 is a planar view showing a conventional reticle carriage mechanism.

Next, an exposure apparatus related to a second embodiment of the present invention is described, referred to FIG. 8. The same reference numerals will be used in this embodiment for the parts that are the same or equivalent to those described in the first embodiment, and the description thereabout will be briefly made or entirely omitted. Instead of reticle stage RST in exposure apparatus 10 in the first embodiment previously described, the exposure apparatus in the second embodiment employs a reticle stage based on a double reticle holder method that can have two reticles mounted at the same time, and due to this arrangement, a part of the operations for reticle exchange and exposure is different from the first embodiment. Other parts are the same as the first embodiment; therefore, the following description will focus on the difference.

FIG. 8 shows a planar view of a reticle stage RST' and reticle carrier system 32 in the exposure apparatus of the second embodiment. As is shown in FIG. 8, in the second embodiment, reticle stage RST', based on a double reticle holder method on which reticles R1 and R2 serving as masks can be mounted at the same time, is arranged on reticle base supporting platform 60 making up support columns 52.

On one end of the upper surface of reticle stage RST' in the −X side, an X-axis movable mirror 79X', which is twice as long as X-axis movable mirror 79X described earlier, is provided extending in the Y-axis direction. Therefore, when reticle stage RST moves along the Y-axis direction in between the position above projection optical system PL where exposure is performed, the unloading position, and the loading position, the length measuring beam from the X-axis laser interferometer that makes up reticle laser interferometer 64 is irradiated on the movable mirror at all times. Accordingly, the change over described above will not be necessary.

In addition, as is obvious when comparing FIG. 2 previously described and FIG. 8, the exposure apparatus in the second embodiment employs reticle carrier system 32 as a mask carrier system, which is the same as the first embodiment. The reason for employing reticle carrier system 32 without any changes is because in reticle carrier system 32, since arms of an articulated robot are used as loading arm 71 and unloading arm 73, parts such as the loading buffer, the unloading buffer, and the reticle stage can be arranged at any position as long as it is within the moving range of the arms, and changing the layout of the reticle stage does not cause any serious problems.

In the second embodiment, on retile exchange, the reticle exchange performed on the reticles holder (not shown) on the −Y side (the left side in FIG. 8) goes through the same procedures as the ones described earlier in the first embodiment, however, the reticle exchange that follows on the reticle holder (not shown) on the +Y side (the right side in FIG. 8) is performed while reticle stage RST' is standing still at the reticle loading position of the reticle onto the reticle holder on the −Y side. That is, after reticle R2 is unloaded from the +Y side holder on reticle stage RST', which is standing still at the above loading position by unloading arm 73, the next reticle is loaded by loading arm 71.

Prior to this operation, after loading a new reticle onto the reticle holder on the −Y side, loading arm 71 has to unload a new reticle immediately from loading buffer 25. As a matter of course, the above new reticle is loaded into loading buffer 25 from carrier main body 74 by robot 88, and immediately after the loading, pre-alignment is performed on the reticle by the mechanical reticle positioning unit 131 and noncontact position measuring unit 45.

Other operation procedures on reticle exchange are the same as in the first embodiment.

In addition, regarding the entire exposure process, in the second embodiment, operations such as the setting of various exposure conditions, reticle alignment, and baseline measurement of alignment system ALG1 (and ALG2) are performed in the same manner in the predetermined procedures as in the first embodiment, after the reticle is exchanged, and then, for example, fine alignment of wafer W1 is performed using alignment system ALG1. Then, after the preparatory operations for exposing wafer W1, the pattern of reticle R1 is transferred onto each shot area on wafer W1 in a step-and-scan method, based on the alignment results.

Then, following the above operation, reticle stage RST' is moved and the pattern of reticle R2 is overlaid and transferred onto each shot area of wafer W1 where the pattern of retile R1 is already transferred. That is, double exposure of each shot area on wafer W1 is performed in the manner described above.

In parallel with the double exposure operation performed on wafer W1, wafer exchange and fine alignment using alignment system ALG2 is performed on the other wafer stage WST2, and then wafer stage WST2 moves onto a waiting state.

Then, when pattern transfer of the pattern of reticle R2 onto wafer W1 on wafer stage WST1 has been completed, wafer stage WST1 is moved to the wafer exchange position, and wafer stage WST2 is also moved below projection optical system PL so that double exposure similar to the one previously described (however, in this case, the pattern is transferred in the order of reticle R2 and then reticle R1) is performed on the water on wafer stage WST2. As a matter of course, during this exposure, wafer exchange and wafer alignment is being performed on wafer stage WST1.

According to the exposure apparatus of the second embodiment described above, other than the fact that the same effect can be obtained as the first embodiment, since double exposure is performed using two reticles, the improving effect of the resolution and DOF (depth of focus) can be obtained, as well as the effect of achieving exposure with higher precision.

In the above second embodiment, the case has been described where change over in the interferometer is not necessary because of reticle stage RST being based on the double holder method, however, in both of the above first and second embodiments, positional measurement of reticle stage RST may be performed with the interferometer on scanning exposure and detecting fiducial marks on reticle stage RST, and on reticle exchange, sensors different from the interferometer (for example, a linear encoder) can be used to move retile stage RST. When the wafer stage is based on a double stage method, the reticle alignment system detects the marks on reticle R (or the fiducial marks on the reticle stage) and the fiducial marks of the wafer stage prior to exposure. Therefore, even when the measurement by the reticle interferometer cannot be performed temporarily while another sensor is being used, no special operation is required when the reticle interferometer resumes the measurement, so it does not reduce the throughput.

In addition, the exposure apparatus in the above first embodiment may perform double exposure, and in this case, it is preferable to employ a sequence of performing reticle exchange after exposure using the first reticle on all the wafers in the lot subject to exposure is performed, and then performing double exposure on all the wafers in the same lot using the second reticle. In such a case, double exposure is performed on the same wafer using two reticles, and the wafer is preferably mounted on the same wafer stage in both the first and second exposures. In addition, when double exposure on wafers in a different lot is to be performed following the lot described above, it is preferable to employ a sequence of performing the first exposure of the double exposure using the second reticle mounted on the reticle stage, performing reticle exchange, and then performing the second exposure using the first reticle.

In each of the above embodiments, when the double stage method is employed for reticle stage RST, the reticle exchange position may be set on both sides in the scanning direction (the Y-axis direction) with the exposure position in between, and in parallel with the exposure operation being performed on one stage, the reticle exchange or the like may be performed on the other stage.

In addition, in each of the above embodiments, wafer stages WST1 and WST2 may, for example, be a hybrid positioning stage in which the wafer table can be finely moved in the X-axis and the Y-axis directions in the least, with respect to a stage main body movable in the X-axis and the Y-axis direction. Similarly, reticle stage RST may be a hybrid positioning stage in which a fine movement stage is relatively moved in the X-axis, the Y-axis, and the rotational direction (the θz direction) in the least, with respect to a rough movement stage that is driven in only the scanning direction (the Y-axis direction) with long strokes.

Furthermore, the exposure apparatus in each of the above embodiments employs a twin stage based on a slide method where wafer stage WST1 moves in between alignment system ALG1 and projection optical system PL and wafer stage WST2 moves in between alignment system ALG2 and projection optical system PL. The present invention, however, is not limited to this, and the exposure apparatus may employ a twin stage based on a switching method where only one alignment system is provided and the two wafer stages are moved alternately in between the alignment system and the projection optical system. Details on such a system are disclosed in, for example, International Publication WO 98/40791 (and the corresponding U.S. Pat. No. 6,262,796).

In addition, in each of the above embodiments, base 54 on which the wafer stage is mounted has been made to suspend from barrel supporting platform 46. However, base 54 may be supported by a vibration isolation mechanism different from the vibration isolation mechanism that supports barrel supporting platform 46, and the point is that the body structure, the chamber arrangement, and the like of the exposure apparatus to which the present invention is applied is optional and not limited to the ones described in each of the above embodiments.

In each of the above embodiments, exposure apparatus main body 30 and reticle carrier system 32 have been housed in main body chamber 12, however, the main body chamber 12 may be divided so that exposure apparatus main body 30 and reticle carrier system 32 are arranged in different spaces, or the exposure apparatus main body 30 may be arranged in a chamber different from reticle carrier system 32, and then connected to each other.

In each of the above embodiments, the case has been described where the present invention has been applied to a double wafer stage type scanning stepper that achieves high throughput by parallel processing performed on the two stages. The present invention, however, is not limited to this, and the present invention can also be suitably applied, as a matter of course, to a single stage type scanning stepper, as well as to a step-and-repeat type exposure apparatus that transfers a mask pattern onto a photosensitive object in a state where the mask and photosensitive object are standing still, and sequentially steps the photosensitive object. In addition, the present invention can also be applied to a proximity exposure apparatus that transfers a mask pattern onto a photosensitive object by making the mask come into contact with the photosensitive object, without using the projection optical system.

The usage of the exposure apparatus is not limited to exposure apparatus for manufacturing semiconductor devices, and for example, the present invention may be broadly applied to an exposure apparatus for liquid crystals that transfers a liquid crystal display device pattern on a square shaped glass plate, or to an exposure apparatus for manufacturing parts such as a plasma display, an organic EL, a thin-film magnetic head, a pickup device, a micromachine, a DNA chip, and the like.

In the exposure apparatus in the present invention, the light source is not limited to a KrF excimer laser (248 nm) or an ArF excimer laser (193 nm), but an extra-high pressure mercury lamp may also be used. In this case, an emission line such as a g-line (436 nm) or an i-line (365 nm) may be used as the exposure illumination light. In addition, as the light source, an $F_2$ laser (157 nm) may be used. In addition, for example, as vacuum ultraviolet light other than the laser beams emitted from the above light sources, a harmonic wave may be used that is obtained by amplifying a single-wavelength laser beam in the infrared or visible range emitted by a DFB semiconductor laser or fiber laser, with a fiber amplifier doped with, for example, erbium (Er) (or both erbium and ytteribium (yb)), and by converting the wavelength into ultraviolet light using a nonlinear optical crystal.

In addition, the present invention may also be applied not only to an exposure apparatus for microdevices such as semiconductors, but also to an exposure apparatus that transfers a circuit pattern on a glass substrate or a silicon wafer in order to produce reticles and masks used in an optical exposure apparatus, an EUV exposure apparatus, an X-ray exposure apparatus, an electron beam exposure apparatus, and the like. In the exposure apparatus that uses a DUV (Deep Ultraviolet) light or VUV (Vacuum Ultraviolet) light, normally a transparent reticle is used, and as the reticle substrate, materials such as quartz glass, quartz glass doped with fluorine, fluorite, magnesium fluoride, and crystal are used.

In addition, the magnification of the projection optical system is not limited to a reduction system, and a system of equal magnification or a magnifying system may also be used. In addition, the projection optical system is not limited to a dioptric system, and a catadioptric system or a reflection system may also be used as the optical system.

Semiconductor devices are manufactured by going through processes such as a design step in which the function/performance of the device is designed, a reticle manufacturing step in which a reticle is manufactured based on the design step, a wafer manufacturing step in which a wafer is manufactured from a silicon material, a wafer processing step in which the reticle pattern is transferred onto the wafer by the exposure apparatus described in the embodiments, a device assembly step (including dicing process, bonding process, and packaging process), and an inspection step.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A mask exchanging method in which mask exchange is performed on a mask stage movable in a predetermined direction, said method comprising:

an unloading process in which an unloading arm unloads a mask from said mask stage when said mask stage holding said mask is at a predetermined unloading position;

a loading process in which a loading arm drivable independently from said unloading arm loads a mask on said mask stage when said mask stage holds said mask at a predetermined loading position different from said unloading position; and a moving process in which said mask stage is moved from said unloading position to said loading position in between said unloading process and said loading process.

2. The mask exchanging method of claim 1, said method further comprising:
- a measuring process in which a relative position between said mask and said loading arm is measured in a noncontact manner by the time a mask is loaded onto said mask stage; and
- an adjustment process in which a positional relation between said mask and said mask stage is adjusted when loading of said mask by said loading arm onto said mask stage is performed, taking into consideration results of said measuring.

3. The mask exchange method of claim 1 wherein
a mask carrier system that includes said unloading arm and said loading arm and said mask stage are mounted on different frames, respectively, and in said loading process a positional relation between said mask and said mask stage is adjusted according to a positional relation between said different frames.

4. The mask exchange method of claim 3 wherein
in said loading process, a relative positional relation between said mask and said loading arm is measured, and a positional relation between said mask and said mask stage is also adjusted, taking into consideration results of said measuring.

5. The mask exchange method of claim 1 wherein
said mask stage is provided in an exposure apparatus that synchronously moves a mask and a photosensitive object so that scanning exposure is performed on said photosensitive object with an illumination beam irradiated on said mask in order to transfer a pattern of said mask onto said photosensitive object, and
said unloading position and said loading position are set apart in a scanning direction, which is a direction in which said mask is moved during said scanning exposure.

6. An exposure apparatus that transfers a pattern formed on a mask onto a photosensitive object, said apparatus comprising:
- a mask stage that holds said mask and is movable in at least a predetermined uniaxial direction;
- a mask carrier system that has a loading arm that loads a mask onto said mask stage when said mask stage is at a predetermined loading position and an unloading arm that is driven independently from said loading arm and unloads a mask from said mask stage when said mask stage is at an unloading position different from said loading position; and
- a stage control unit that moves said mask stage from said unloading position to said loading position in between unloading operation of said mask by said unloading arm and loading operation of a mask by said loading arm.

7. The exposure apparatus of claim 6, said apparatus further comprising:
- a noncontact position measuring unit that measures a relative position between said mask and said loading arm in a noncontact manner by the time a mask is loaded onto said mask stage; and
- a control unit that adjusts a positional relation between said mask and said mask stage when loading of said mask by said loading arm onto said mask stage is performed, taking into consideration results of said measuring by said noncontact position measuring unit.

8. The exposure apparatus of claim 6 wherein
loading of a mask onto said mask stage and unloading of a mask from said mask stage are performed by combining relative movement of said loading arm and said unloading arm, respectively, and said mask stage within a predetermined plane, and relative movement of said loading arm and said unloading arm, respectively, and said mask stage in a direction perpendicular to said predetermined plane.

9. The exposure apparatus of claim 8 wherein
at least one of said loading arm and said unloading arm is movable in both said predetermined plane and in said direction perpendicular to said predetermined plane.

10. The exposure apparatus of claim 6 wherein
a plurality of masks can be mounted on said mask stage along a collinear direction in which said loading position and said unloading position are arranged.

11. The exposure apparatus of claim 10, said apparatus further comprising:
a plurality of object stages that can move independently, each holding said photosensitive object.

12. The exposure apparatus of claim 6, said apparatus further comprising:
an unloading buffer on which a mask that has been unloaded from said mask stage is mounted.

13. The exposure apparatus of claim 12, said apparatus further comprising:
a loading buffer on which a mask to be loaded onto said mask stage is temporarily mounted.

14. The exposure apparatus of claim 13 wherein
a positioning unit that mechanically positions a mask is provided on said loading buffer.

15. The exposure apparatus of claim 6, said apparatus further comprising:
a loading buffer on which a mask to be loaded onto said mask stage is temporarily mounted.

16. The exposure apparatus of claim 15 wherein
a positioning unit that mechanically positions a mask is provided on said loading buffer.

17. The exposure apparatus of claim 6, said apparatus further comprising:
a plurality of object stages that can move independently, each holding said photosensitive object.

18. The exposure apparatus of claim 6, said apparatus further comprising:
- a main body on which said mask stage is mounted and transfer of said pattern is performed;
- a carrier system supporting frame on which said mask carrier system is mounted, said frame arranged separately from said main body;
- a measuring sensor that measures a relative positional relation between said main body and said carrier system supporting frame; and
- a control unit that adjust a positional relation between said mask and said mask stage when said mask is loaded onto said mask stage by said loading arm, taking into consideration measurement results of said measuring sensor.

19. The exposure apparatus of claim 18, said apparatus further comprising:
a position measuring unit that measures a relative position between said mask and said loading arm in a noncontact manner by the time a mask is loaded onto said mask stage, wherein
said control unit adjusts a positional relation between said mask and said mask stage, taking into consideration measurement results of said position measuring unit.

20. The exposure apparatus of claim 6, said apparatus further comprising:

a position measuring unit that measures a relative position between said mask and said loading arm in a noncontact manner by the time a mask is loaded onto said mask stage; and a control unit that adjusts a positional relation between said mask and said mask stage when loading of said mask by said loading arm onto said mask stage is performed, taking into consideration measurement results of said position measuring unit.

21. An exposure apparatus that transfers a pattern formed on a mask onto a photosensitive object, said apparatus comprising:

a mask stage that holds said mask and is movable in at least a predetermined uniaxial direction;

a mask carrier system that includes a loading arm used for loading said mask onto said mask stage and an unloading arm driven independently from said loading arm for unloading said mask from said mask stage;

a position measuring unit that measures a relative position between said mask and said loading arm in a noncontact manner by the time a mask is loaded onto said mask stage; and a control unit that adjusts a positional relation between said mask and said mask stage when loading of said mask by said loading arm onto said mask stage is performed, taking into consideration measurement results of said position measuring unit, and an unloading position where said unloading arm performs unloading operation of a mask and a loading position where said loading arm performs loading operation of a mask with respect to said mask stage are set at different positions, and said apparatus further comprising:

a stage control unit that moves said mask stage from said unloading position to said loading position in between unloading operation of a mask from said mask stage by said unloading arm and loading operation of a mask onto said mask stage by said loading arm.

22. The exposure apparatus of claim 21, said apparatus further comprising:

a main body on which said mask stage is mounted and transfer of said pattern is performed;

a carrier system supporting frame on which said mask carrier system is mounted, said frame arranged separately from said main body; and a measuring sensor that measures a relative positional relation between said main body and said carrier system supporting frame, wherein said control unit adjusts a positional relation between said mask and said mask stage when said mask is loaded, taking into consideration measurement results of said measuring sensor.

* * * * *